US012787266B2

(12) United States Patent
Choi et al.

(10) Patent No.: US 12,787,266 B2
(45) Date of Patent: Nov. 3, 2026

(54) SEMICONDUCTOR MEMORY DEVICE

(71) Applicant: Samsung Electronics Co., Ltd., Suwon-si (KR)

(72) Inventors: Ah Rang Choi, Hwaseong-si (KR); Chan-Sic Yoon, Anyang-si (KR); Jung-Hoon Han, Hwaseong-si (KR); Gyu Hyun Kil, Hwaseong-si (KR); Weon Hong Kim, Suwon-si (KR); Doo San Back, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 596 days.

(21) Appl. No.: 17/737,115

(22) Filed: May 5, 2022

(65) Prior Publication Data

US 2023/0071440 A1 Mar. 9, 2023

(30) Foreign Application Priority Data

Sep. 9, 2021 (KR) ........................ 10-2021-0120144

(51) Int. Cl.
*H10B 12/00* (2023.01)

(52) U.S. Cl.
CPC ............. *H10B 12/50* (2023.02); *H10B 12/09* (2023.02); *H10B 12/315* (2023.02); *H10B 12/34* (2023.02)

(58) Field of Classification Search
CPC ........... H01L 27/092; H01L 21/823878; H01L 21/823807; H01L 21/823842;
(Continued)

(56) References Cited

U.S. PATENT DOCUMENTS 7,989,281 B2 8/2011 Kim
8,716,088 B2 5/2014 Ando et al.
(Continued)

FOREIGN PATENT DOCUMENTS

TW 202133323 A 9/2021
TW 202133408 A 9/2021

OTHER PUBLICATIONS

Office Action dated Apr. 12, 2023, issued in corresponding Taiwanese Patent Application No. 111129878.
(Continued)

*Primary Examiner* — Vongsavanh Sengdara
(74) *Attorney, Agent, or Firm* — P.L.C. HARNESS, DICKEY & PIERCE, P.L.C.

(57) ABSTRACT

Inventive concepts relate to a semiconductor memory device. The semiconductor memory device comprising, a substrate comprising an NMOS region and a PMOS region, a first gate pattern the NMOS region of the substrate, and a second gate pattern disposed on the PMOS region of the substrate. The first gate pattern comprises a first high-k layer, a diffusion mitigation pattern, an N-type work function pattern, and a first gate electrode, which are sequentially stacked on the substrate, the second gate pattern comprises a second high-k layer and a second gate electrode which are sequentially stacked on the substrate, the diffusion mitigation pattern is in contact with the first high-k layer, a stacked structure of the first gate electrode is the same as that of the second gate electrode, and the second gate pattern does not comprise the N-type work function pattern.

18 Claims, 34 Drawing Sheets

(58) Field of Classification Search
CPC .......... H01L 21/823857; H10B 12/482; H10B 12/05; H10B 12/34; H10B 12/50; H10B 12/313; H10B 12/09
See application file for complete search history.

(56) References Cited

U.S. PATENT DOCUMENTS

| | | | | |
|---|---|---|---|---|
| 9,406,678 | B2 | 8/2016 | Ji et al. | |
| 10,170,477 | B2 | 1/2019 | Bao et al. | |
| 10,332,894 | B2 | 6/2019 | Jung et al. | |
| 10,361,194 | B2 | 7/2019 | Park et al. | |
| 10,910,363 | B2 | 2/2021 | Lee et al. | |
| 2009/0230479 | A1* | 9/2009 | Hsu | H10D 30/0227 257/407 |
| 2009/0261424 | A1* | 10/2009 | Chang | H10D 64/01318 438/585 |
| 2011/0180851 | A1 | 7/2011 | Doyle et al. | |
| 2012/0132998 | A1 | 5/2012 | Kwon et al. | |
| 2019/0326278 | A1* | 10/2019 | Lee | H10B 12/09 |
| 2021/0125980 | A1 | 4/2021 | Lee et al. | |
| 2021/0134597 | A1* | 5/2021 | Ji | H10D 64/0134 |

OTHER PUBLICATIONS

Korean Notice of Allowance dated Oct. 17, 2025 in Korean Patent Application No. 10-2021-0120144.

* cited by examiner

SEMICONDUCTOR MEMORY DEVICE

CROSS-REFERENCE TO RELATED APPLICATION

This application claims priority from Korean Patent Application No. 10-2021-0120144 filed on Sep. 9, 2021 in the Korean Intellectual Property Office, and all the benefits accruing therefrom under 35 U.S.C. 119, the contents of which in its entirety are herein incorporated by reference.

BACKGROUND

Some example embodiments relate to a semiconductor memory device.

A semiconductor memory device includes a plurality of transistors. Transistors integrated into semiconductor memory devices are formed in various structures according to required performance such as an operating voltage and/or a driving current. For example, there is a complementary mode (CMOS) element structure in which an NMOS element and a PMOS element have metal gate electrodes of different conductivity types. Alternatively or additionally, a thickness of the gate insulating layer included in these elements may vary depending on an applied voltage.

SUMMARY

Some example embodiments provide a semiconductor memory device with improved reliability.

However, aspects of example embodiments are not restricted to the one set forth herein. The above and other aspects of inventive concepts will become more apparent to one of ordinary skill in the art to which inventive concepts pertains by referencing the detailed description of inventive concepts given below.

According to some example embodiments, there is provided a semiconductor memory device comprising a substrate comprising an NMOS region and a PMOS region, a first gate pattern on the NMOS region of the substrate, and a second gate pattern on the PMOS region of the substrate. The first gate pattern comprises a first high-k layer, a diffusion mitigation pattern, an N-type work function pattern, and a first gate electrode, which are sequentially stacked on the substrate, the second gate pattern comprises a second high-k layer and a second gate electrode which are sequentially stacked on the substrate, the diffusion mitigation pattern is in contact with the first high-k layer, a stacked structure of the first gate electrode is the same as that of the second gate electrode, and the second gate pattern does not comprise the N-type work function pattern.

According to some example embodiments, there is provided a semiconductor memory device comprising a substrate comprising first to fourth peripheral regions, first to fourth peripheral insulating layers respectively on the first to fourth peripheral region of the substrate, the first peripheral insulating layer thicker than the second peripheral insulating layer, the third peripheral insulating layer thicker than the fourth peripheral insulating layer, first to third peripheral gate patterns respectively on the first to third peripheral insulating layers, a channel layer disposed between the substrate of the fourth peripheral region and the fourth peripheral insulating layer, the channel layer comprising silicon germanium, and a fourth peripheral gate pattern on the channel layer. The first peripheral gate pattern comprises a first peripheral high-k layer, a first peripheral diffusion mitigation pattern, a first peripheral N-type work function pattern, and a first peripheral gate electrode, which are sequentially stacked on the substrate, the second peripheral gate pattern comprises a second peripheral high-k layer, a second peripheral diffusion mitigation pattern, a second peripheral N-type work function pattern, and a second peripheral gate electrode, which are sequentially stacked on the substrate, the third peripheral gate pattern comprises a third peripheral high-k layer and a third peripheral gate electrode which are sequentially stacked on the substrate. The fourth peripheral gate pattern comprises a fourth peripheral high-k layer and a fourth peripheral gate electrode which are sequentially stacked on the channel layer, the first peripheral diffusion mitigation pattern is in contact with the first peripheral high-k layer, the second peripheral diffusion mitigation pattern is in contact with the second peripheral high-k layer, the first to fourth peripheral gate electrodes have the same stacked structure, and the third and fourth peripheral gate patterns do not comprise the first and second peripheral N-type work function patterns.

According to some example embodiments, there is provided a semiconductor memory device comprising, a substrate comprising a cell array region, a first peripheral region, and a second peripheral region, a bit line crossing the substrate in the cell array region, a buffer layer interposed between the bit line and the substrate, a first peripheral gate pattern on the first peripheral region of the substrate, and a second peripheral gate pattern on the second peripheral region of the substrate. The first peripheral gate pattern comprises a first high-k layer, a diffusion mitigation pattern, an N-type work function pattern, and a first gate electrode, which are sequentially stacked on the substrate, the second peripheral gate pattern comprises a second high-k layer and a second gate electrode which are sequentially stacked on the substrate, the diffusion mitigation pattern is in contact with the first high-k layer, the first gate electrode, the second gate electrode, and the bit line have the same stacked structure, and the second peripheral gate pattern does not comprise the N-type work function pattern.

BRIEF DESCRIPTION OF THE DRAWINGS

The above and other aspects and features of inventive concepts will become more apparent by describing in detail some example embodiments thereof with reference to the attached drawings, in which.

DETAILED DESCRIPTION OF EXAMPLE EMBODIMENTS

Hereinafter, to describe inventive concepts in more detail, it will be described in more detail with reference to the accompanying drawings according to some example embodiments of inventive concepts.

Figure 1:
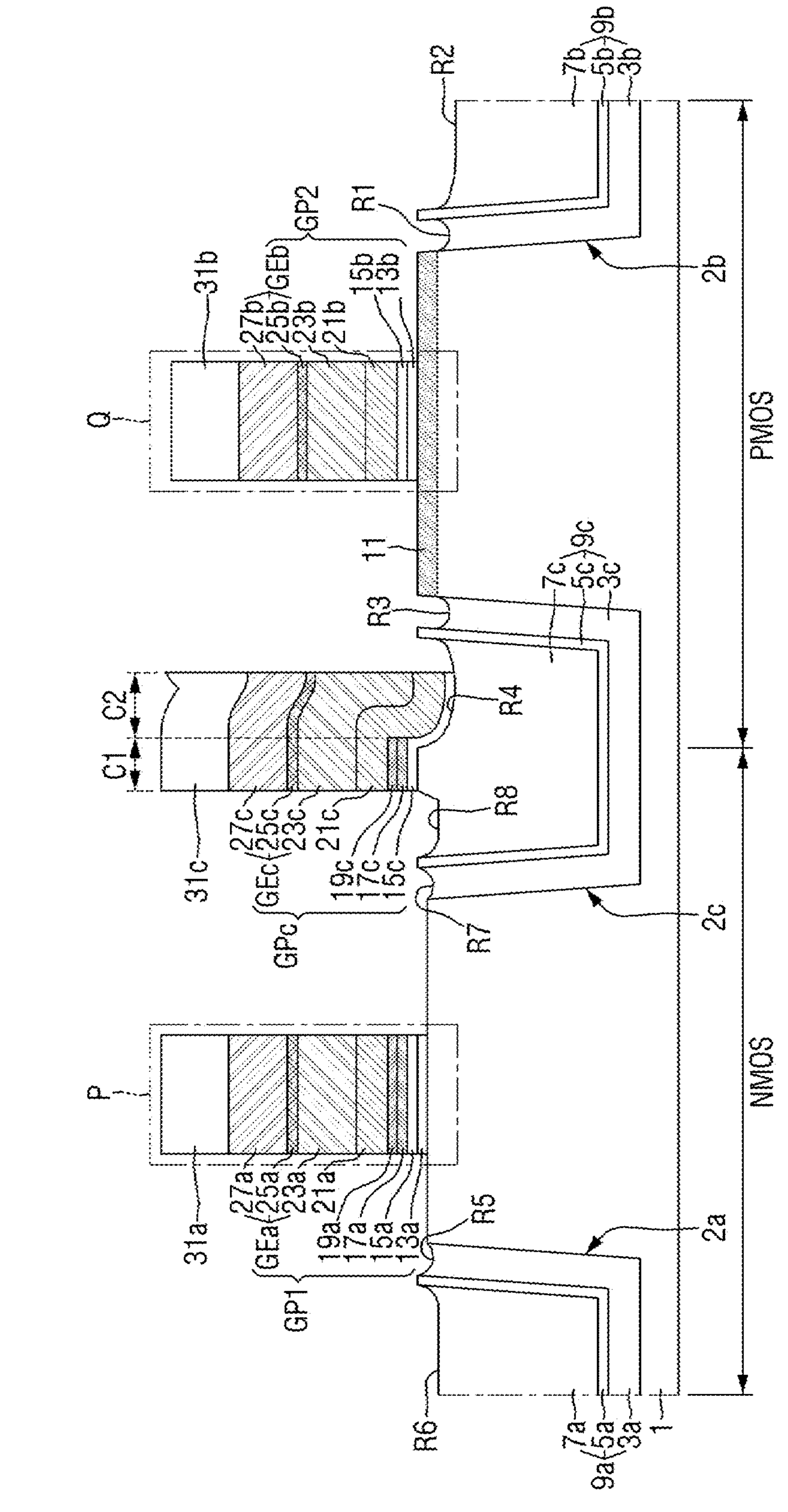
FIG. 1 is an example cross-sectional view of a semiconductor memory device according to some example embodiments.
Figure 2:
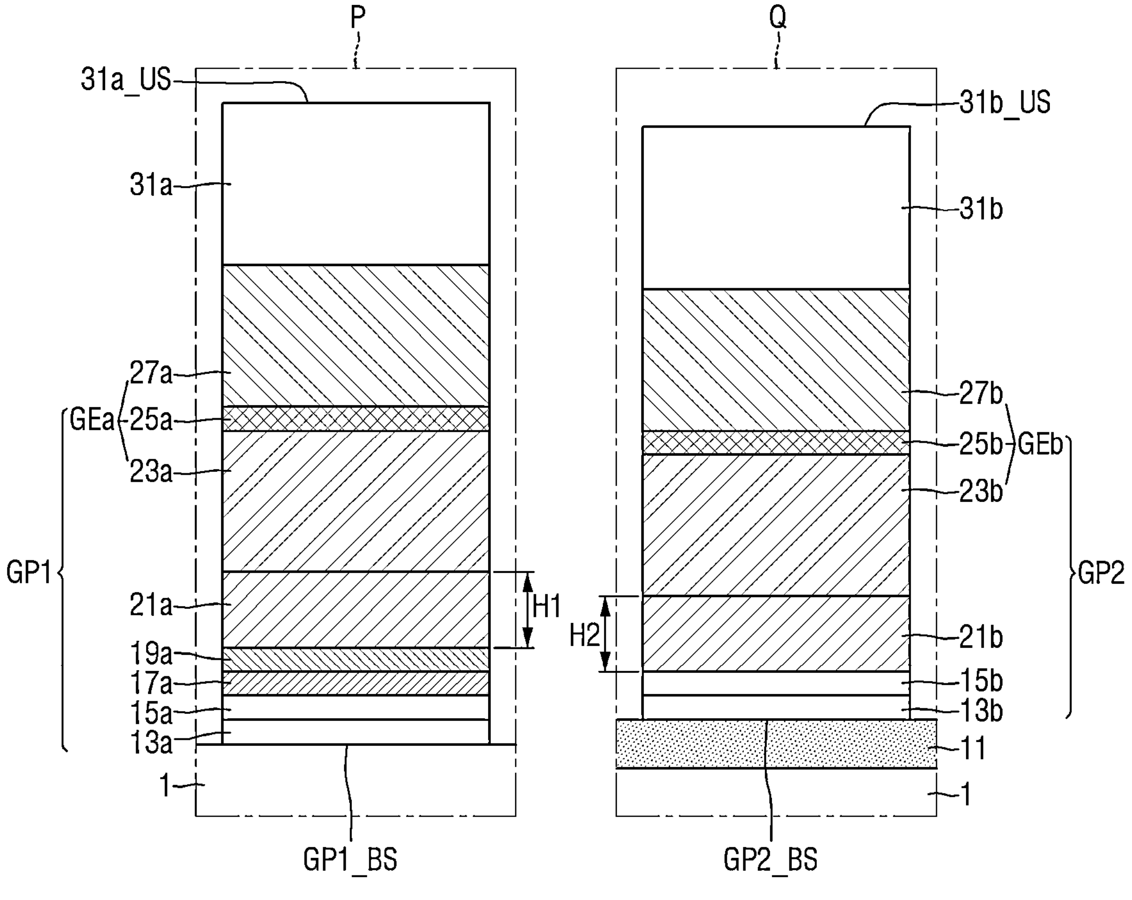
FIG. 2 is an enlarged view of area P and area Q of FIG. 1.

FIG. 1 is an example cross-sectional view of a semiconductor memory device according to some example embodiments. FIG. 2 is an enlarged view of area P and area Q of FIG. 1.

In the drawings of the semiconductor memory device according to some example embodiments, a dynamic random access memory (DRAM) is illustrated as an example, but inventive concepts are not limited thereto.

Referring to FIGS. 1 and 2, a substrate 1 including an NMOS region and a PMOS region is provided.

The substrate 1 may be or may include, for example, a silicon single crystal substrate or a silicon on insulator (SOI) substrate, and may be doped or undoped. Alternatively or additionally, the substrate 1 may include one or more of silicon germanium, silicon germanium on insulator (SGOI), indium antimonide, a lead tellurium compound, indium arsenide, indium phosphide, gallium arsenide, or gallium antimonide, but is not limited thereto.

A first trench 2*a* may be formed in the substrate 1 of the NMOS region. A second trench 2*b* may be formed in the substrate 1 of the PMOS region. At a boundary between the NMOS region and the PMOS region, a third trench 2*c* may be formed in the substrate 1. A first element isolation layer 9*a* may be disposed in the first trench 2*a*. A second element isolation layer 9*b* may be disposed in the second trench 2*b*. A third element isolation layer 9*c* may be disposed in the third trench 2*c*.

The first element isolation layer 9*a* may include a first liner 3*a* covering or conformally covering the inner sidewall and bottom surface of the first trench 2*a*, a first buried insulating layer 7*a* filling the first trench 2*a*, and a second liner 5*a* interposed between the first liner 3*a* and the first buried insulating layer 7*a*.

The second element isolation layer 9*b* may include a third liner 3*b* covering or conformally covering the inner sidewall and the bottom surface of the second trench 2*b*, a second buried insulating layer 7*b* filling the second trench 2*b*, and a fourth liner 5*b* interposed between the third liner 3*b* and the second buried insulating layer 7*b*.

The third element isolation layer 9*c* may include a fifth liner 3*c* covering or conformally covering the inner sidewall and bottom surface of the third trench 2*c*, a third buried insulating layer 7*c* filling the third trench 2*c*, and a sixth liner 5*c* interposed between the fifth liner 3*c* and the third buried insulating layer 7*c*.

The first liner 3*a*, the third liner 3*b*, and the fifth liner 3*c* may include, e.g. may be made of, the same material. For example, each of the first liner 3*a*, the third liner 3*b*, and the fifth liner 3*c* may include silicon oxide. The second liner 5*a*, the fourth liner 5*b*, and the sixth liner 5*c* may include, e.g. may be made of, the same material. For example, the second liner 5*a*, the fourth liner 5*b*, and the sixth liner 5*c* may each include silicon nitride. The first buried insulating layer 7*a*, the second buried insulating layer 7*b*, and the third buried insulating layer 7*c* may include, e.g. may be made of, the same material. For example, each of the first buried insulating layer 7*a*, the second buried insulating layer 7*b*, and the third buried insulating layer 7*c* may include silicon oxide.

A first gate pattern GP1 may be disposed on the substrate 1 in the NMOS region. Although not illustrated, sources and drains may be disposed in the substrate 1 on both sides of the first gate pattern GP1. The source and drain of the NMOS region may be doped with, for example, an N-type impurity such as at least one of phosphorus or arsenic.

A channel layer 11 may be disposed on the substrate 1 in the PMOS region. The lattice constant of the channel layer 11 may be greater than the lattice constant of the substrate 1. For example, the channel layer 11 may be formed of silicon germanium, while the substrate 1 may be formed of silicon. The channel layer 11 may include silicon germanium, for example only within the PMOS region. The channel layer 11 may improve hole mobility in the PMOS transistor. There may be strain on the channel layer 11. In addition, the channel layer 11 may serve to lower the work function. A second gate pattern GP2 may be disposed on the channel layer 11. Although not illustrated, a source and a drain may be disposed in the channel layer 11 on both sides of the second gate pattern GP2 and the substrate 1. The source and drain of the PMOS region may be doped with a P-type impurity such as boron.

A dummy gate pattern GPc may be disposed at a boundary between the NMOS region and the PMOS region. Although the dummy gate pattern GPc does not actually operate or is electrically floating, the dummy gate pattern GPc may be formed to maintain or help to maintain constant etching process condition at all positions and prevent a loading effect. Alternatively or additionally, the dummy gate pattern GPc may be formed to prevent a dishing phenomenon in a subsequent chemical mechanical polishing (CMP) process for forming an interlayer insulating layer.

The first gate pattern GP1 may include a first gate insulating layer 13*a*, a first high dielectric (high-k) layer 15*a*, a diffusion mitigation pattern or diffusion prevention pattern 17*a*, an N-type work function pattern 19*a*, a first conductive pattern 21*a*, and a first gate electrode Gea, which are sequentially stacked. A first gate capping pattern 31*a* may be disposed on the first gate pattern GP1. The first gate capping pattern 31*a* may be disposed on the first gate electrode Gea. The diffusion prevention pattern 17*a* may be in contact with the first high-k layer 15*a*. The first high-k layer 15*a* may have a dielectric constant greater than silicon oxide (SiO2).

The second gate pattern GP2 may include a second gate insulating layer 13*b*, a second high dielectric (high-k) layer 15*b*, a second conductive pattern 21*b*, and a second gate electrode Geb, which are sequentially stacked. A second gate capping pattern 31*b* may be disposed on the second gate pattern GP2. The second gate capping pattern 31*b* may be disposed on the second gate electrode Geb. The second gate pattern GP2 may not include either or both of the diffusion mitigation pattern or diffusion prevention pattern 17*a* and the N-type work function pattern 19*a*. The second high-k layer 15*b* may be in contact with the second conductive pattern 21*b*. The second high-k dielectric layer 15*b* may have a dielectric constant greater than silicon oxide (SiO2), and may or may not have the same dielectric constant as that of the first high-k layer 15*a*.

A vertical length of the first gate pattern GP1 may be greater than a vertical length of the second gate pattern GP2; however, example embodiments are not limited thereto. For example, since the first gate pattern GP1 includes the diffusion prevention pattern 17*a* and the N-type work function pattern 19*a* and the second gate pattern GP2 does not include the diffusion prevention pattern 17*a* and the N-type work function pattern 19*a*, the vertical length of the first gate pattern GP1 may be greater than the vertical length of the second gate pattern GP2.

A dummy gate capping pattern 31*c* may be disposed on the dummy gate pattern GPc. The dummy gate pattern GPc may include a first portion C1 adjacent to the NMOS region and a second portion C2 adjacent to the PMOS region. A bottom surface of the first portion C1 of the dummy gate pattern GPc may be at a higher level than a bottom surface of the second portion C2 of the dummy gate pattern GPc.

The first portion C1 of the dummy gate pattern GPc may include a dummy high-k layer 15_c_, a dummy diffusion mitigation pattern or dummy diffusion prevention pattern 17_c_, a dummy N-type work function pattern 19_c_, a dummy conductive pattern 21_c_, and a dummy gate electrode Gec, which are sequentially stacked.

The second portion C2 of the dummy gate pattern GPc does not include the dummy diffusion prevention pattern 17_c_ and the dummy N-type work function pattern 19_c_. In the second portion C2 of the dummy gate pattern GP2, the dummy conductive pattern 21_c_ may be in contact with the dummy high-k layer 15_c_. In the second portion C2, a part of the top surface of the dummy gate electrode Gec and the top surface of the dummy gate capping pattern 31_c_ may be recessed.

The first gate insulating layer 13_a_ and the second gate insulating layer 13_b_ may include, for example, silicon oxide, silicon oxynitride, or a combination thereof, and may include the same or different material. The first high-k layer 15_a_, the second high-k layer 15_b_, and the dummy high-k layer 15_c_ may include a material having a higher dielectric constant than silicon oxide. The first high-k layer 15_a_, the second high-k layer 15_b_, and the dummy high-k layer 15_c_ may include, for example, at least one of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or a combination thereof.

The diffusion prevention pattern 17_a_ and the dummy diffusion prevention pattern 17_c_ may include, for example, titanium nitride, tungsten nitride, or tantalum nitride. Preferably, the diffusion prevention pattern 17_a_ and the dummy diffusion prevention pattern 17_c_ include titanium nitride (TiN). The diffusion prevention pattern 17_a_ and the dummy diffusion prevention pattern 17_c_ may at least partially mitigate or reduce or prevent diffusion of lanthanum (La) included in the N-type work function pattern 19_a_. The diffusion prevention pattern 17_a_ may be in contact with the first high-k layer 15_a_. The dummy diffusion prevention pattern 17_c_ may be in contact with the dummy high-k layer 15_c_.

The N-type work function pattern 19_a_ and the dummy N-type work function pattern 19_c_ may include, for example, at least one of lanthanum (La), lanthanum oxide (LaO), magnesium (Mg), magnesium oxide (MgO), tantalum (Ta), tantalum nitride (TaN), or niobium (Nb).

The first gate electrode Gea may include a first lower electrode 23_a_, a first middle electrode 25_a_, and a first upper electrode 27_a_. The first lower electrode 23_a_, the first middle electrode 25_a_, and the first upper electrode 27_a_ may be sequentially stacked. The second gate electrode Geb may include a second lower electrode 23_b_, a second middle electrode 25_b_, and a second upper electrode 27_b_. The second lower electrode 23_b_, the second middle electrode 25_b_, and the second upper electrode 27_b_ may be sequentially stacked. The dummy gate electrode Gec may include a dummy lower electrode 23_c_, a dummy middle electrode 25_c_, and a dummy upper electrode 27_c_. The dummy lower electrode 23_c_, the dummy middle electrode 25_c_, and the dummy upper electrode 27_c_ may be sequentially stacked. The first gate electrode Gea, the second gate electrode Geb, and the dummy gate electrode Gec may all have the same stacked structure, e.g. may all have the same elements and/or layers with the same thickness that are arranged in the same manner and/or connected to each other in the same manner.

Each of the first lower electrode 23_a_, the second lower electrode 23_b_, and the dummy lower electrode 23_c_ may include polysilicon doped with an impurity. The conductivity type of the impurity doped into the first lower electrode 23_a_ may be different from the conductivity type of the impurity doped into the second lower electrode 23_b_. For example, the first lower electrode 23_a_ may be doped with an N-type impurity such as one or more of phosphorus or arsenic, and the second lower electrode 23_b_ may be doped with a P-type impurity such as boron. Each of the first middle electrode 25_a_, the second middle electrode 25_b_, and the dummy middle electrode 25_c_ may include TiSiN. Each of the first upper electrode 27_a_, the second upper electrode 27_b_, and the dummy upper electrode 27_c_ may include tungsten (W). However, the technical spirit of inventive concepts is not limited thereto.

Each of the first gate capping pattern 31_a_, the second gate capping pattern 31_b_, and the dummy gate capping pattern 31_c_ may include silicon nitride, but is not limited thereto.

In the second element isolation layer 9_b_, an upper portion of the fourth liner 5_b_ may protrude more than upper portions of the third liner 3_b_ and the second buried insulating layer 7_b_. A first recess R1 may be formed on the third liner 3_b_. A second recess R2 may be formed on the second buried insulating layer 7_b_. A vertical depth from the bottom surface of the second gate pattern GP2 to the lowest point of the first recess R1 may be less than a vertical depth from the bottom surface of the second gate pattern GP2 to the lowest point of the second recess R2. A depth of the second recess R2 may be greater than a depth of the first recess R1. For example, the second buried insulating layer 7_b_ may be recessed more than the third liner 3_b_.

In the third element isolation layer 9_c_, an upper portion of the sixth liner 5_c_ may protrude more than upper portions of the fifth liner 3_c_ and the third buried insulating layer 7_c_. A third recess R3 may be formed on the fifth liner 3_c_ adjacent to the second portion C2 of the dummy gate pattern GPc. A fourth recess R4 may be formed on the third buried insulating layer 7_c_ adjacent to the second portion C2 of the dummy gate pattern GPc. A vertical depth from the bottom surface of the second gate pattern GP2 to the lowest point of the third recess R3 may be the same as a vertical depth from the bottom surface of the second gate pattern GP2 to the lowest point of the first recess R1. A vertical depth from the bottom surface of the second gate pattern GP2 to the lowest point of the fourth recess R4 may be the same as a vertical depth from the bottom surface of the second gate pattern GP2 to the lowest point of the second recess R2.

In the first 9_a_, an upper portion of the second liner 5_a_ may protrude more than upper portions of the first liner 3_a_ and the first buried insulating layer 7_a_. A fifth recess R5 may be formed on the first liner 3_a_. A sixth recess R6 may be formed on the first buried insulating layer 7_a_. A vertical depth from the bottom surface of the first gate pattern GP1 to the lowest point of the fifth recess R5 may be smaller than a vertical depth from the bottom surface of the first gate pattern GP1 to the lowest point of the sixth recess R6.

A vertical depth of the first recess R1 may be greater than (deeper than) a vertical depth of the fifth recess R5. A vertical depth of the second recess R2 may be greater than (deeper than) a vertical depth of the sixth recess R6.

A seventh recess R7 may be formed on the fifth liner 3_c_ adjacent to the first portion C1 of the dummy gate pattern GPc. An eighth recess R8 may be formed on the third buried insulating layer 7c adjacent to the first portion C1 of the dummy gate pattern GPc. A vertical depth from the bottom surface of the first gate pattern GP1 to the lowest point of the seventh recess R7 may be the same as a vertical depth from the bottom surface of the first gate pattern GP1 to the lowest point of the fifth recess R5. A vertical depth from the bottom surface of the first gate pattern GP1 to low points such as the lowest point of the eighth recess R8 may be the same as a vertical depth from the bottom surface of the first gate pattern GP1 to the lowest point of the sixth recess R6.

In FIG. 2, a bottom surface GP1_BS of the first gate pattern GP1 may be lower than a bottom surface GP2_BS of the second gate pattern GP2. The first gate pattern GP1 may be in contact with the substrate 1. The second gate pattern GP2 may be in contact with the channel layer 11. The top surface of the substrate 1 may be positioned lower than the top surface of the channel layer 11. Accordingly, the bottom surface GP1_BS of the first gate pattern GP1 may be positioned lower than the bottom surface GP2_BS of the second gate pattern GP2.

The first gate insulating layer 13a may be in contact with the substrate 1. A bottom surface of the first gate insulating layer 13a may be in contact with a top surface of the substrate 1. The second gate insulating layer 13b may be in contact with the channel layer 11. A bottom surface of the second gate insulating layer 13b may be in contact with a top surface of the channel layer 11.

The first high-k layer 15a may be in contact with the first gate insulating layer 13a. The second high-k layer 15b may be in contact with the second gate insulating layer 13b. The diffusion prevention pattern 17a may be in contact with the first high-k layer 15a. A bottom surface of the diffusion prevention pattern 17a may be in contact with a top surface of the first high-k layer 15a. The diffusion prevention pattern 17a may be in contact with the N-type work function pattern 19a. The top surface of the diffusion prevention pattern 17a may be in contact with the bottom surface of the N-type work function pattern 19a.

In some example embodiments, the diffusion prevention pattern 17a may be a single layer including titanium nitride (TiN), but example embodiments are not limited thereto.

The first gate pattern GP1 may include the first conductive pattern 21a on the N-type work function pattern 19a. The first conductive pattern 21a may be in contact with the N-type work function pattern 19a. The second gate pattern GP2 may include the second conductive pattern 21b on the second high-k layer 15b. The second conductive pattern 21b may be in contact with the second high-k layer 15b.

In some example embodiments, a vertical length H1 of the first conductive pattern 21a may be the same as a vertical length H2 of the second conductive pattern 21b. The first conductive pattern 21a and the second conductive pattern 21b may be formed by the same process, e.g. at the same time. Accordingly, a vertical length of the first conductive pattern 21a may be the same as a vertical length of the second conductive pattern 21b.

Each of the first conductive pattern 21a and the second conductive pattern 21b may include titanium nitride (TiN). Each of the first conductive pattern 21a and the second conductive pattern 21b may be a single layer, but is not limited thereto.

In some example embodiments, the stacked structure of the first gate electrode Gea and the second gate electrode Geb may be the same; e.g. may have the same elements arranged in the same manner A vertical length of the first gate electrode Gea is the same as a vertical length of the second gate electrode Geb. In addition, a vertical length of the first lower electrode 23a is the same as a vertical length of the second lower electrode 23b. A vertical length of the first middle electrode 25a is the same as a vertical length of the second middle electrode 25b. A vertical length of the first upper electrode 27a is the same as a vertical length of the second upper electrode 27b. The first gate electrode Gea and the second gate electrode Geb may be formed by the same process, e.g. at the same time.

A vertical length of the first gate capping pattern 31a may be the same as a vertical length of the second gate capping pattern 31b. The first gate capping pattern 31a and the second gate capping pattern 31b may be formed by the same process, e.g. at the same time.

In some example embodiments, a top surface 31a_US of the first gate capping pattern 31a may not be positioned on the same plane as a top surface 31b_US of the second gate capping pattern 31b. Although it is illustrated that the top surface 31a_US of the first gate capping pattern 31a is higher than the top surface 31b_US of the second gate capping pattern 31b, this is only for simplicity of description and is not limited thereto. The top surface 31a_US of the first gate capping pattern 31a may be formed to be lower than the top surface 31b_US of the second gate capping pattern 31b.

FIGS. 3 to 8 are cross-sectional views illustrating a semiconductor memory device according to various example embodiments. For reference, FIGS. 3 to 8 may be enlarged views of the first gate pattern GP1 and the second gate pattern GP2. Hereinafter, a semiconductor memory device according to various example embodiments will be described with reference to FIGS. 3 to 8. For simplicity of description, the following description will focus on differences from the description with reference to FIGS. 1 and 2.

Figure 3:
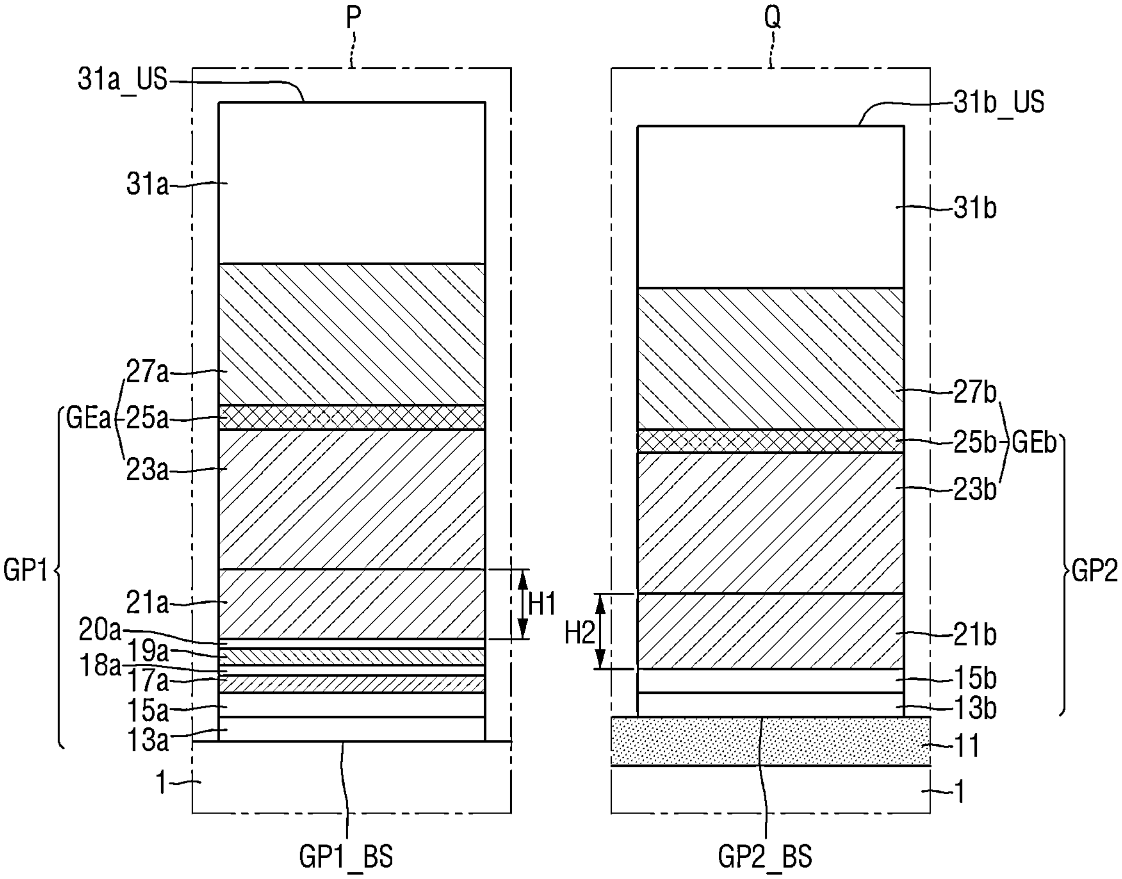
FIGS. 3 to 8 are cross-sectional views illustrating a semiconductor memory device according to some example embodiments.

Referring to FIG. 3, the first gate pattern GP1 may further include a first boundary pattern 18a and a second boundary pattern 20a.

The first boundary pattern 18a may be formed at a boundary between the diffusion prevention pattern 17a and the N-type work function pattern 19a. The first boundary pattern 18a may include a compound in which the diffusion prevention pattern 17a and the N-type work function pattern 19a are oxidized, or a compound included in the diffusion prevention pattern 17a and the N-type work function pattern 19a. For example, the first boundary pattern 18a may include at least one of lanthanum titanium nitride (LaTiN) or lanthanum titanium oxynitride (LaTiNO), but is not limited thereto.

As the first boundary pattern 18a is formed, the vertical length of the diffusion prevention pattern 17a may be reduced. In addition, as the first boundary pattern 18a is formed, the vertical length of the N-type work function pattern 19a may be reduced. The first boundary pattern 18a may be formed when the diffusion prevention pattern 17a and the N-type work function pattern 19a are oxidized (e.g. oxidized natively and/or in a controlled process) at the boundary between the diffusion prevention pattern 17a and the N-type work function pattern 19a.

The second boundary pattern 20a may be formed at the boundary between the N-type work function pattern 19a and the first conductive pattern 21a. The second boundary pattern 20a may include a compound in which the N-type work function pattern 19a and the first conductive pattern 21a are oxidized, and/or the compound included in the N-type work function pattern 19a and the first conductive pattern 21a. For example, the second boundary pattern 20a may include at least one of lanthanum titanium nitride (LaTiN) or lanthanum titanium oxynitride (LaTiNO), but is not limited thereto.

As the second boundary pattern 20*a* is formed, the vertical length of the N-type work function pattern 19*a* may be reduced. In addition, as the second boundary pattern 20*a* is formed, the vertical length of the first conductive pattern 21*a* may be reduced. For example, when the second boundary pattern 20*a* is formed, the vertical length H1 of the first conductive pattern 21*a* may be smaller than the vertical length H2 of the second conductive pattern 21*b*. That is, the second boundary pattern 20*a* may be formed when the N-type work function pattern 19*a* and the first conductive pattern 21*a* are oxidized at the boundary between the N-type work function pattern 19*a* and the first conductive pattern 21*a*.

Figure 4:
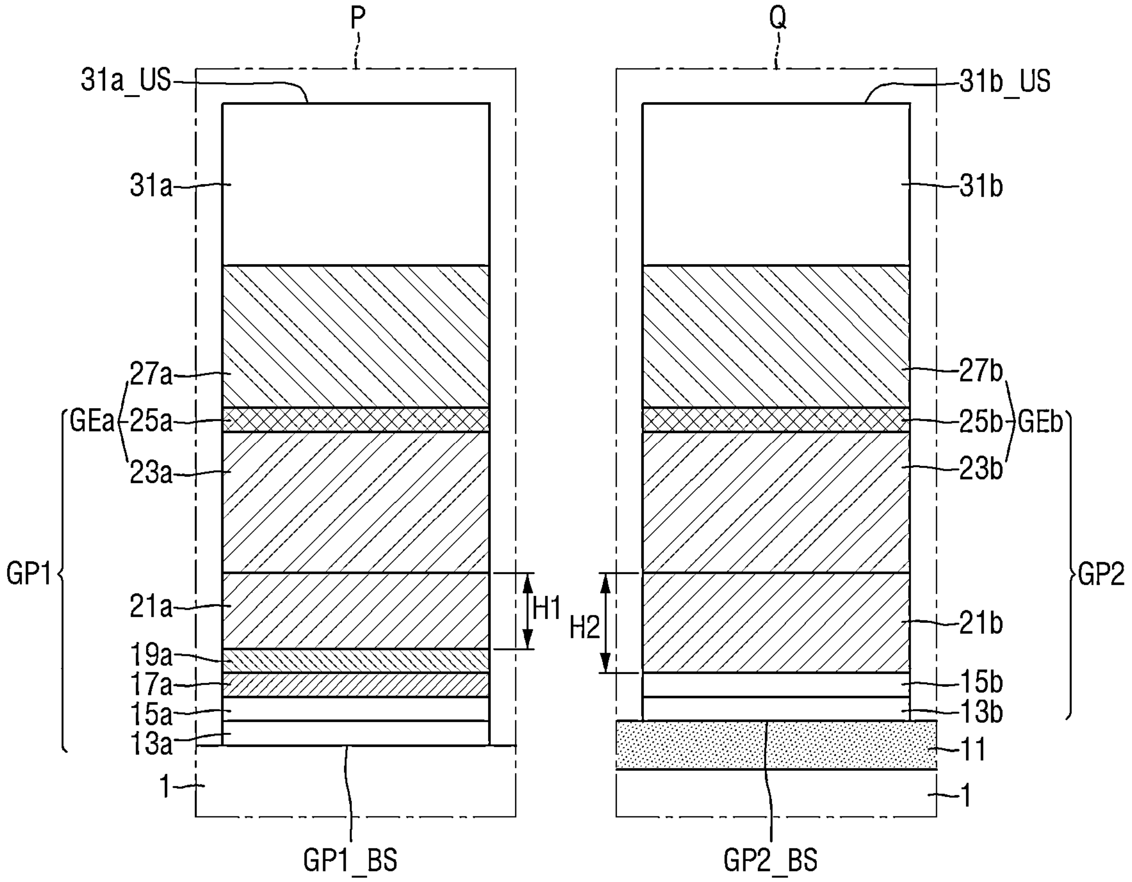

Referring to FIG. 4, the vertical length H1 of the first conductive pattern 21*a* may be smaller than the vertical length H2 of the second conductive pattern 21*b*. For example, the second conductive pattern 21*b* may be a single layer and may be shared with a part of the first conductive pattern 21*a*. For example, the second conductive pattern 21*b* may be formed by the same process as, e.g. at the same time as, the process of forming the first conductive pattern 21*a*.

Figure 12:
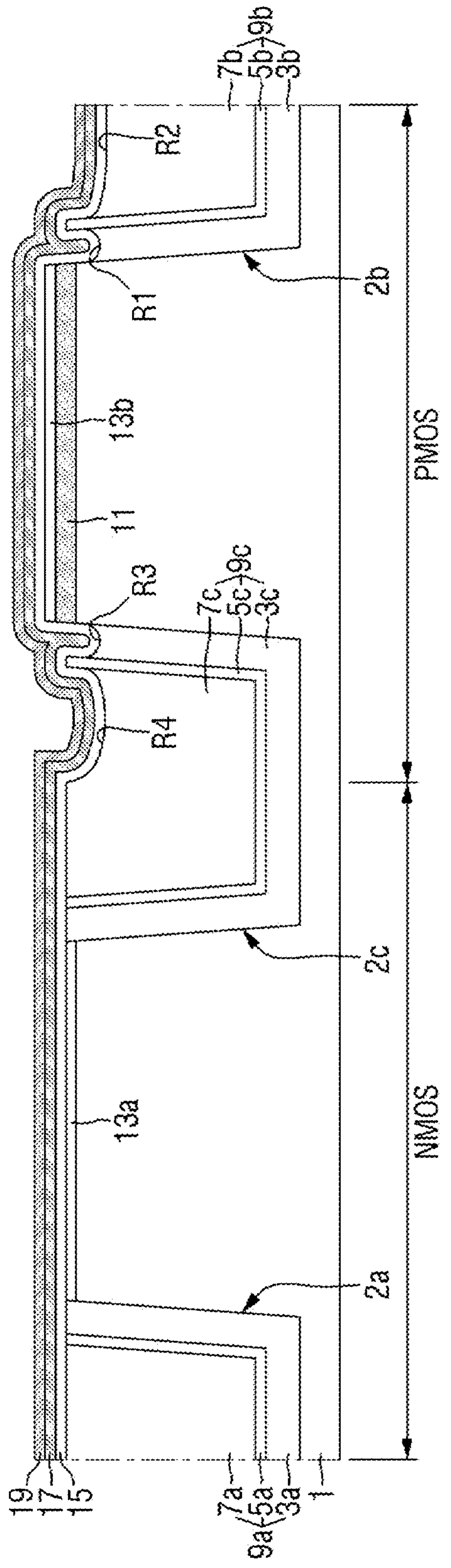

When the diffusion prevention pattern 17*a* and the N-type work function pattern 19*a* are formed, the diffusion prevention layer 17 in FIG. 12 and the N-type work function layer 19 in FIG. 12 may also be formed in the PMOS region. Subsequently, the diffusion prevention layer and the N-type work function layer formed in the PMOS region may be removed, e.g. while remaining in the NMOS region. In the process of removing the diffusion prevention layer and the N-type work function layer, a part of the diffusion prevention layer may not be removed. Accordingly, a diffusion prevention pattern having a thickness such as a variably determined (or, alternatively, predetermined) thickness may remain on the second high-k layer 15*b*.

The material forming the second conductive pattern 21*b* is the same as the material forming the diffusion prevention pattern 17*a*. Accordingly, when the second conductive pattern 21*b* is formed on the diffusion prevention layer that is not removed and remains on the second high-k layer 15*b* of the PMOS region, the vertical length H2 of the second conductive pattern 21*b* may be larger than the length in a case in which the entire diffusion prevention layer formed on the second high-k layer 15*b* is removed. Accordingly, the vertical length H2 of the second conductive pattern 21*b* may be greater than the vertical length H1 of the first conductive pattern 21*a*.

In addition, in FIG. 4, the top surface 31*a*_US of the first gate capping pattern 31*a* may be positioned on the same plane as the top surface 31*b*_US of the second gate capping pattern 31*b*. As the thickness of the second conductive pattern 21*b* increases, the top surface 31*b*_US of the second gate capping pattern 31*b* may also be higher than the top surface 31*b*_US of the second gate capping pattern 31*b* of FIG. 2. However, the technical spirit of inventive concepts is not limited thereto.

Figure 5:
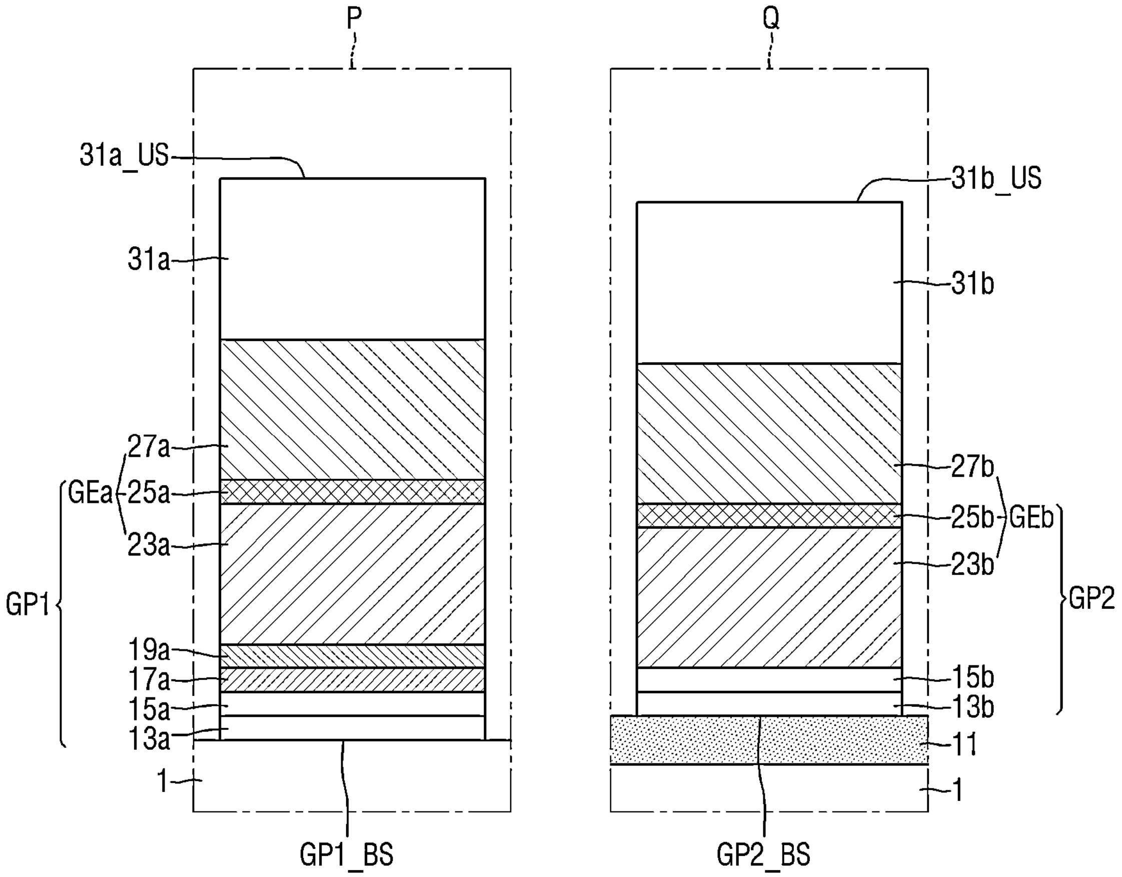

Referring to FIG. 5, the first conductive pattern 21*a* and the second conductive pattern 21*b* may not be formed.

In the NMOS region, the first gate electrode Gea may be formed on, e.g. directly on the diffusion prevention pattern 17*a* and the N-type work function pattern 19*a*. In the PMOS region, the second gate electrode Geb may be formed on, e.g. directly on the second high-k layer 15*b*.

In the NMOS region, the N-type work function pattern 19*a* may be in contact with the first lower electrode 23*a*. In the PMOS region, the second high-k layer 15*b* may be in contact with the second lower electrode 23*b*.

Figure 6:
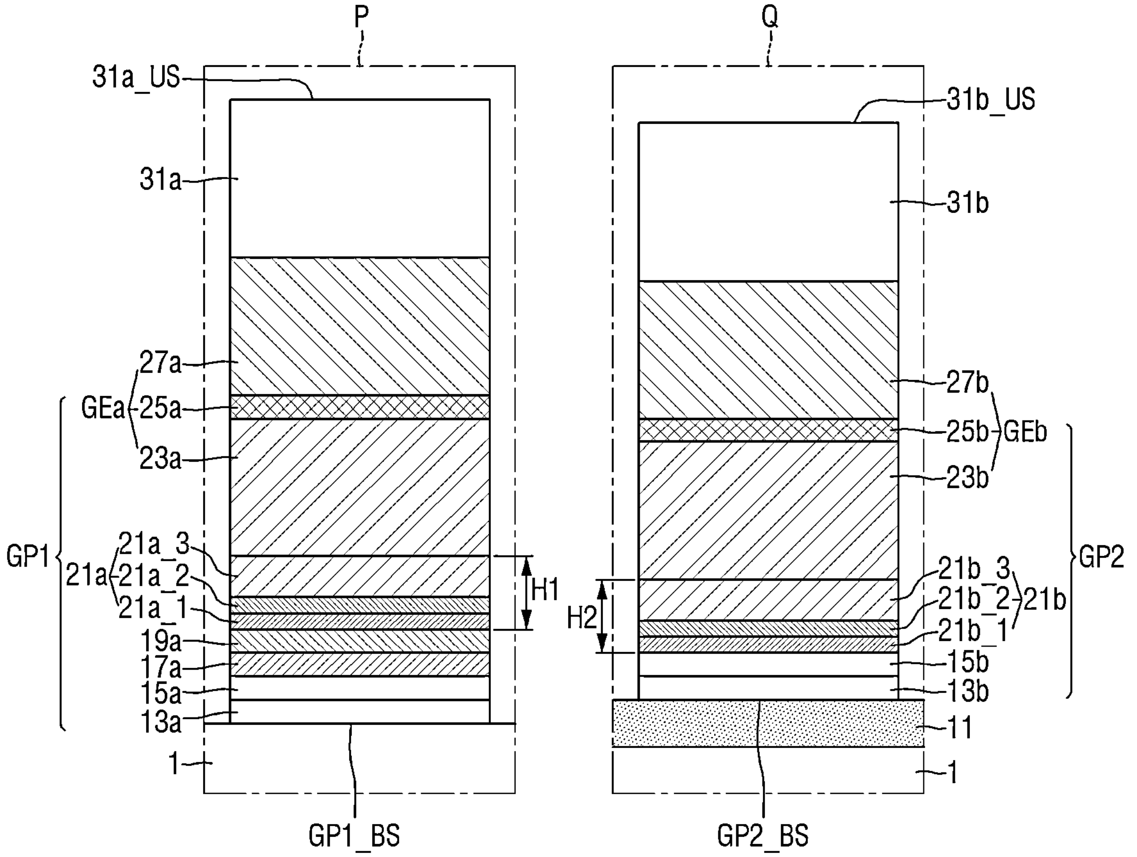

Referring to FIG. 6, the first conductive pattern 21*a* and the second conductive pattern 21*b* may be constituted with multiple layers.

For example, the first conductive pattern 21*a* may include a first lower conductive pattern 21*a*_1, a first P-type work function pattern 21*a*_2, and a first upper conductive pattern 21*a*_3. The second conductive pattern 21*b* may include a second lower conductive pattern 21*b*_1, a second P-type work function pattern 21*b*_2, and a second upper conductive pattern 21*b*_3.

The first conductive pattern 21*a* and the second conductive pattern 21*b* may have the same stacked structure, e.g. the same layers arranged in the same manner with the same thicknesses. The vertical length H1 of the first conductive pattern 21*a* may be the same as the vertical length H2 of the second conductive pattern 21*b*.

The thickness of the first lower conductive pattern 21*a*_1 and the thickness of the second lower conductive pattern 21*b*_1 may be the same. The thickness of the first P-type work function pattern 21*a*_2 and the thickness of the second P-type work function pattern 21*b*_2 may be the same. The thickness of the first upper conductive pattern 21*a*_3 and the thickness of the second upper conductive pattern 21*b*_3 may be the same.

Each of the first lower conductive pattern 21*a*_1 and the second lower conductive pattern 21*b*_1 may include titanium nitride (TiN). Each of the first P-type work function pattern 21*a*_2 and the second P-type work function pattern 21*b*_2 may include aluminum (Al). Each of the first upper conductive pattern 21*a*_3 and the second upper conductive pattern 21*b*_3 may include titanium nitride (TiN). However, the technical spirit of inventive concepts are not limited thereto.

Figure 7:
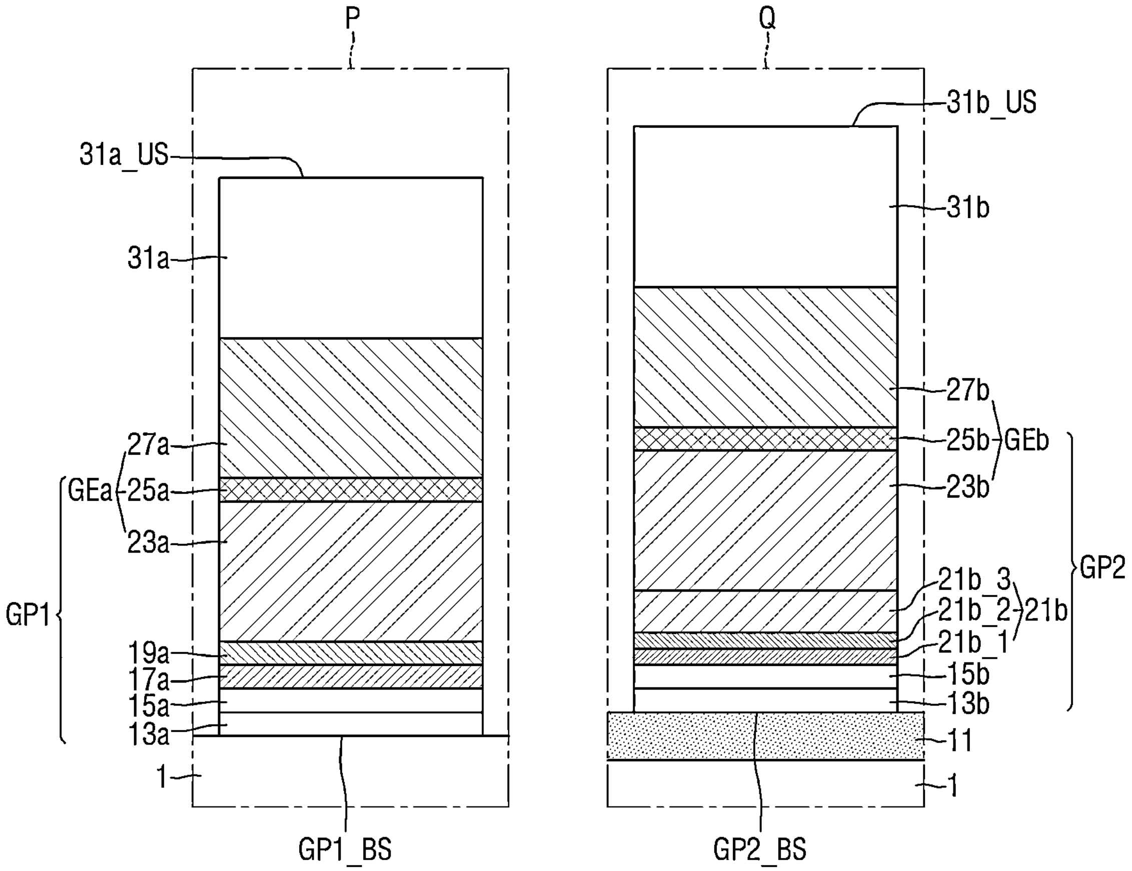

Referring to FIG. 7, the first conductive pattern 21*a* may not be formed in, and/or may be removed from, the NMOS region.

The second conductive pattern 21*b* may be formed only in the PMOS region. The second conductive pattern 21*b* may be multiple layers including the second P-type work function pattern 21*b*_2. The first gate pattern GP1 of the NMOS region may not include a P-type work function pattern.

After the conductive layer is formed in both the NMOS region and the PMOS region, only the conductive layer in the NMOS region may be removed. Accordingly, the second conductive pattern 21*b* may remain only in the PMOS region.

Figure 8:
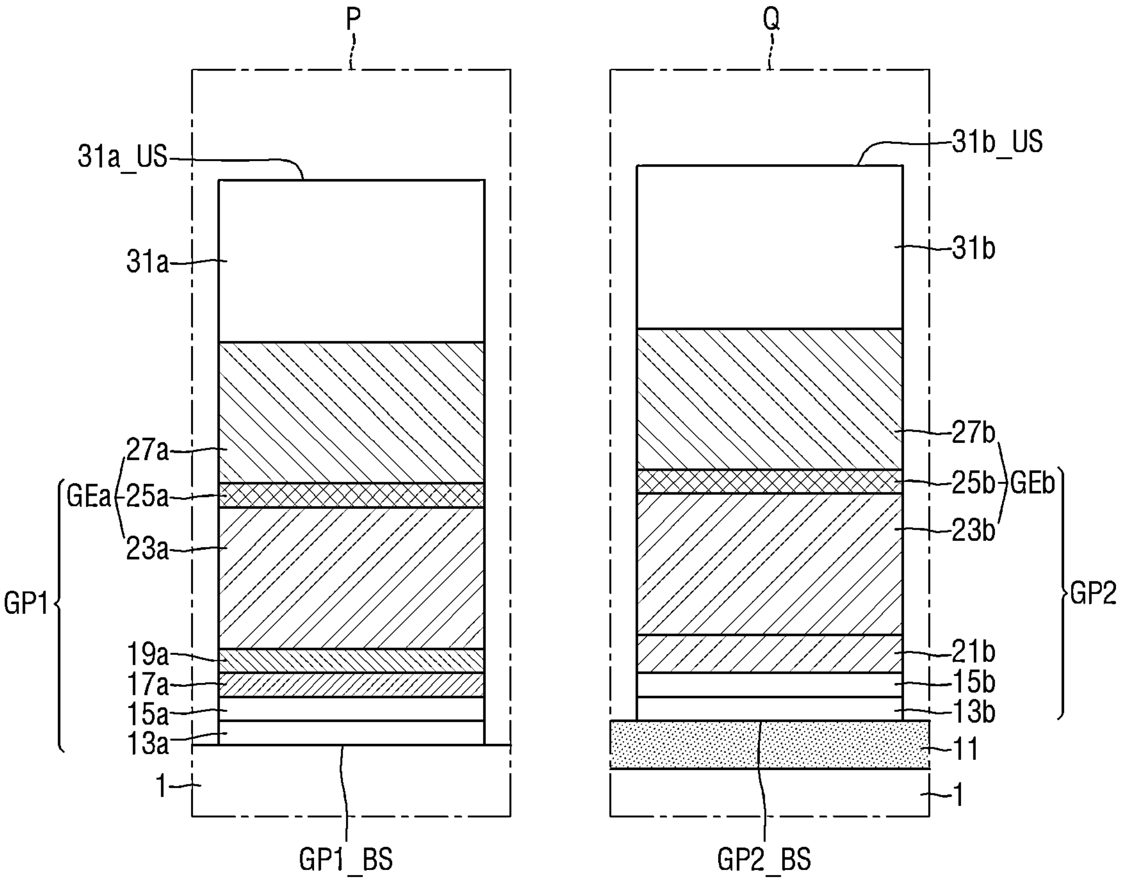

Referring to FIG. 8, the first conductive pattern 21*a* may not be formed in the NMOS region, and the second conductive pattern 21*b* in the PMOS region may be a single layer.

For example, in both the NMOS region and the PMOS region, the diffusion prevention layer 17 in FIG. 12 and the N-type work function layer 19 in FIG. 12 may be formed, and in the process of removing the diffusion prevention layer and the N-type work function layer in the PMOS region, a part of the diffusion prevention layer in the PMOS region may not be removed.

The diffusion prevention layer that is not partially removed may become the second conductive pattern 21*b*. The second conductive pattern 21*b* may be a single layer including titanium nitride (TiN).

FIGS. 9 to 16 are views sequentially illustrating a process of manufacturing or fabricating the semiconductor memory device having the cross section of FIG. 1. Hereinafter, a method of manufacturing the semiconductor memory device having the cross section of FIG. 1 will be described with reference to FIGS. 9 to 16.

Figure 9:
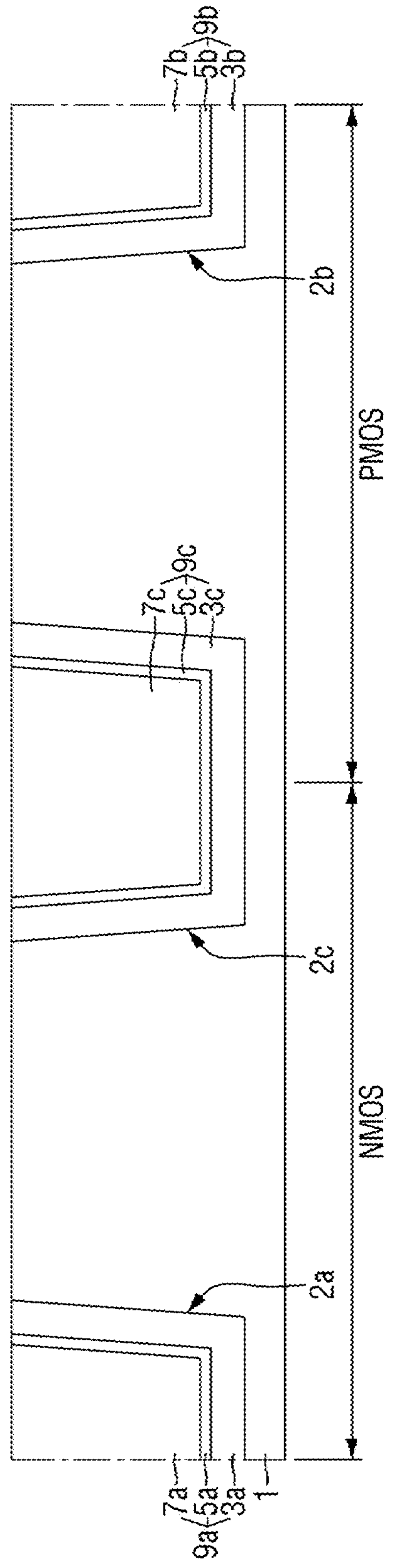
FIGS. 9 to 16 are views sequentially illustrating a process of manufacturing or fabricating the semiconductor memory device having the cross section of FIG. 1.

Referring to FIG. 9, the substrate 1 including the NMOS region and the PMOS region is prepared.

The substrate 1 is etched to form first to third trenches 2*a*, 2*b*, and 2*c*. A first liner layer and a second liner layer are conformally formed, e.g., deposited with a process such as a chemical vapor deposition (CVD) process, on the front surface of the substrate 1. A buried insulating layer is formed to fill the first to third trenches 2*a*, 2*b*, and 2*c*. A planarization process such as a CMP process and/or an etch-back process is performed to form the first to third element isolation layers 9*a*, 9*b*, and 9*c* in the first to third trenches 2*a*, 2*b*, and 2*c*.

The first element isolation layer 9*a* may include the first liner 3*a* conformally covering the inner wall and bottom surface of the first trench 2*a*, the first buried insulating layer 7*a* filling the first trench 2*a*, and the second liner 5*a* interposed between the first liner 3*a* and the first buried insulating layer 7*a*. The second element isolation layer 9*b* may include the third liner 3*b* conformally covering the inner wall and the bottom surface of the second trench 2*b*, the second buried insulating layer 7*b* filling the second trench 2*b*, and the fourth liner 5*b* interposed between the third liner 3*b* and the second buried insulating layer 7*b*. The third element isolation layer 9*c* may include the fifth liner 3*c* conformally covering the inner wall and bottom surface of the third trench 2*c*, the third buried insulating layer 7*c* filling the third trench 2*c*, and the sixth liner 5*c* interposed between the fifth liner 3*c* and the third buried insulating layer 7*c*.

Figure 10:
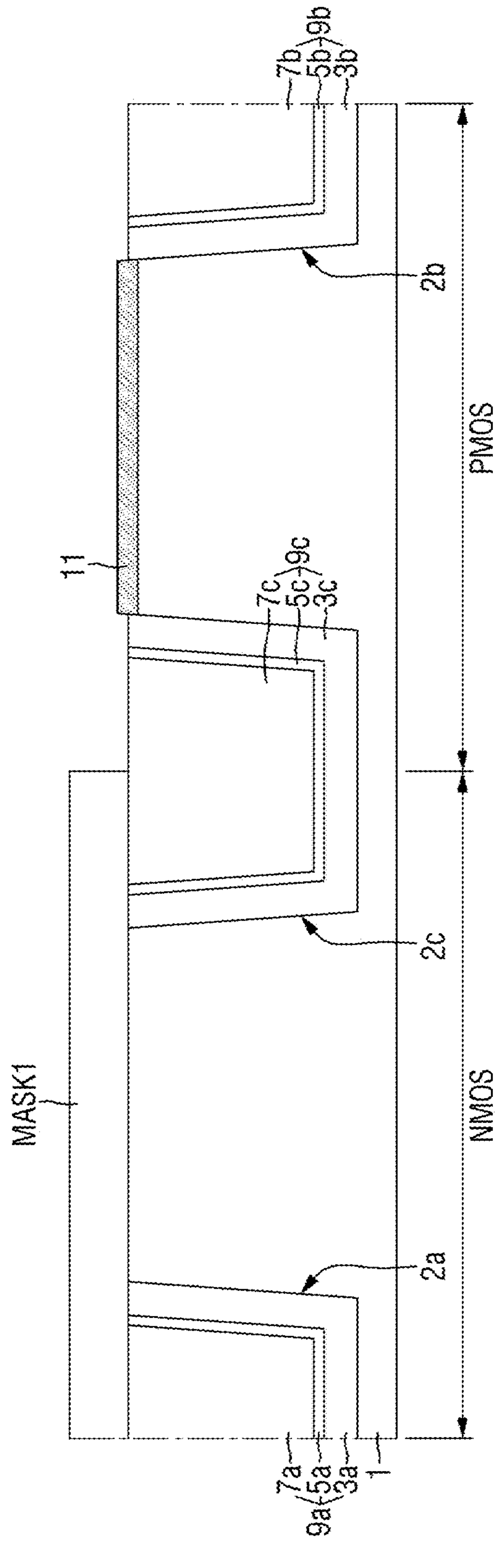

Referring to FIG. 10, a first mask layer MASK1 covering the NMOS region and exposing the PMOS region is formed.

The first mask layer MASK1 may be formed of, for example, a silicon oxide layer. The first mask layer MASK1 may cover a part of the third element isolation layer 9*c* and expose the other part. The channel layer 11 is formed on the top surface of the substrate 1 exposed in the PMOS region by using the first mask layer MASK1 as an epitaxial barrier. The channel layer 11 may be formed by, for example, selective epitaxial growth (SEG). The channel layer 11 may include silicon germanium, e.g. the channel layer may be epitaxial silicon germanium (eSiGe). The channel layer 11 is not formed on the first to third element isolation layers 9*a*, 9*b*, and 9*c*.

Figure 11:
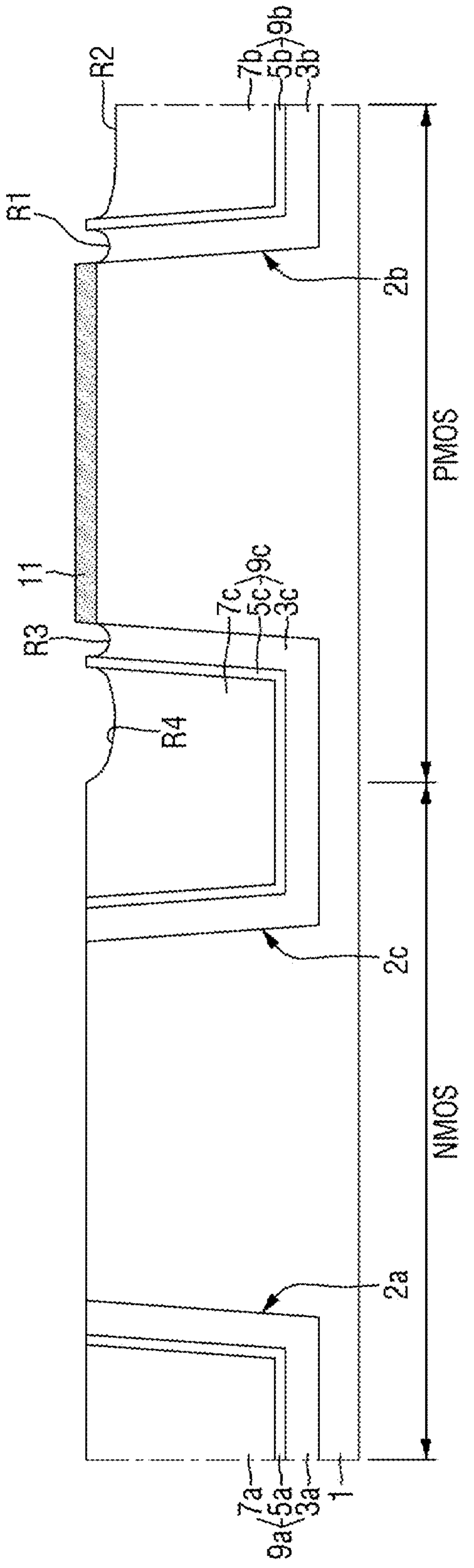

Referring to FIG. 11, the first mask layer MASK1 may be removed. For example, the first mask layer MASK1 may be removed by a wet etching process including but not limited to a buffered oxide etch (BOE).

When the first mask layer MASK1 is formed of a silicon oxide layer, hydrofluoric acid may be used as an etchant in a wet etching process. When the first mask layer MASK1 is removed, a part of the second element isolation layer 9*b* and a part of the third element isolation layer 9*c* exposed in the PMOS region may be etched like the first mask layer MASK1.

For example, the upper portions of the third liner 3*b*, the second buried insulating layer 7*b*, the fifth liner 3*c*, and the third buried insulating layer 7*c* constituted with the same material as the first mask layer MASK1 may be partially etched. Accordingly, the first recess R1 may be formed on the third liner 3*b*. The second recess R2 may be formed on the second buried insulating layer 7*b*. The third recess R3 may be formed on the fifth liner 3*c*. The fourth recess R4 may be formed on the third buried insulating layer 7*c*.

The third liner 3*b* and the fifth liner 3*c* have a relatively narrow width. Accordingly, penetration of the etchant may be relatively difficult. On the other hand, since the second buried insulating layer 7*b* and the third buried insulating layer 7*c* have a large, exposed area, penetration of the etchant may be more easily performed. Accordingly, the depths of the first recess R1 and the third recess R3 may be less than the depths of the second recess R2 and the fourth recess R4.

The fourth liner 5*b* and the sixth liner 5*c* including a material different from that of the first mask layer MASK1 are not etched like the first mask layer MASK1. Accordingly, the upper portions of the fourth liner 5*b* and the sixth liner 5*c* may protrude from the third liner 3*b*, the second buried insulating layer 7*b*, the fifth liner 3*c*, and the third buried insulating layer 7*c*.

Referring to FIG. 12, a first gate insulating layer 13*a* may be formed on the substrate 1 in the NMOS region. The second gate insulating layer 13*b* may be formed on the channel layer 11 in the PMOS region.

The first and second gate insulating layers 13*a* and 13*b* may be simultaneously formed by a thermal oxidation process and/or a deposition process. The first and second gate insulating layers 13*a* and 13*b* may be formed of, for example, a silicon oxide layer. Although not illustrated, a cleaning process may be performed on the surface of the substrate 1 before the first and second gate insulating layers 13*a* and 13*b* are formed. Surfaces of the first to third element isolation layers 9*a*, 9*b*, and 9*c* may also be partially etched by the cleaning process.

Subsequently, a pre high-k layer 15 may be formed on the substrate 1. The diffusion prevention layer 17 may be formed on the pre high-k layer 15. The N-type work function layer 19 may be formed on the diffusion prevention layer 17. The diffusion prevention layer 17 and the N-type work function layer 19 may be difficult to be conformally deposited in the first recess R1 and the third recess R3, and thus have relatively thin thicknesses.

The pre high-k layer 15 may include, for example, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or a combination thereof.

The diffusion prevention layer 17 may include, for example, titanium nitride (TiN). The N-type work function layer 19 may include, for example, at least one of lanthanum (La), lanthanum oxide (LaO), magnesium (Mg), magnesium oxide (MgO), tantalum (Ta), tantalum nitride (TaN), or niobium (Nb). However, the technical spirit of inventive concepts are not limited thereto.

Figure 13:
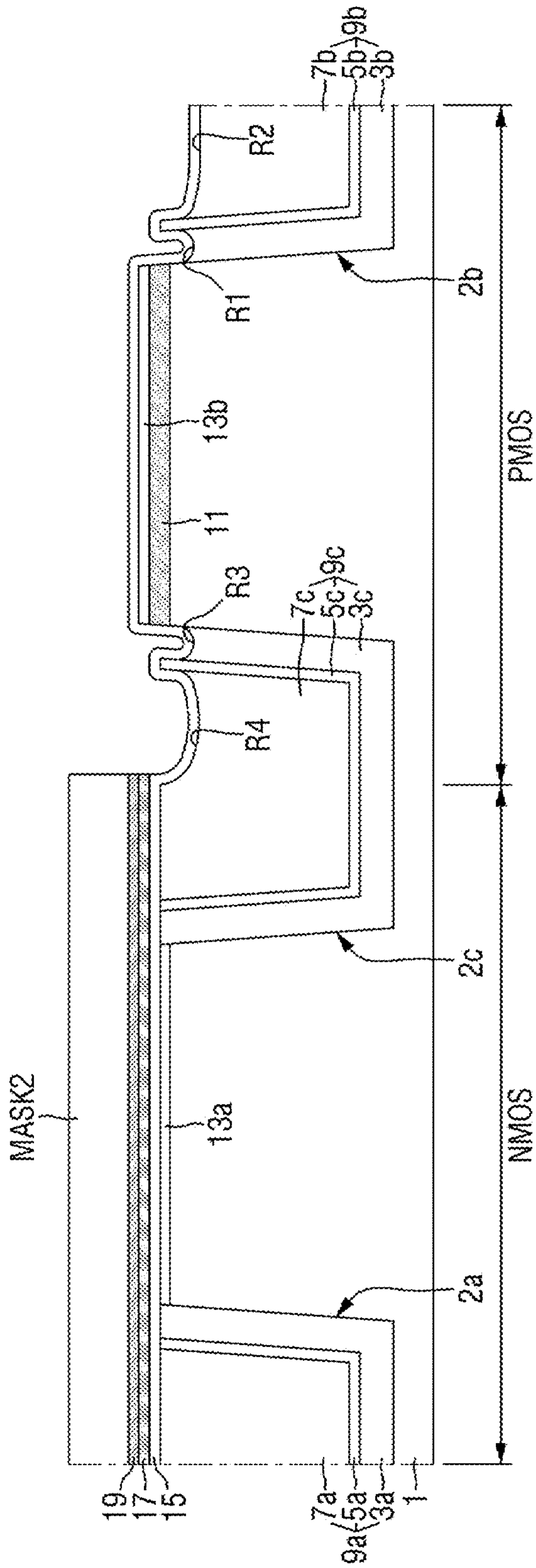

Referring to FIG. 13, a second mask layer MASK2 covering the NMOS region and exposing the PMOS region may be formed on the N-type work function layer 19.

The second mask layer MASK2 may be formed of at least one of a photoresist layer, an amorphous carbon layer (ACL), a spin on hardmask (SOH), a spin on carbon (SOC), or a silicon nitride layer.

The pre high-k layer 15 is exposed by etching the N-type work function layer 19 and the diffusion prevention layer 17 in the PMOS region using the second mask layer MASK2 as an etching mask. The N-type work function layer 19 and the diffusion prevention layer 17 of the PMOS region may be removed using a wet etching process. For example, the wet etching process may be performed using an etchant containing sulfuric acid. The wet etching process may significantly reduce etch damage to the pre high-k layer 15 compared to a dry etching process.

Although it is illustrated that the N-type work function layer 19 and the diffusion prevention layer 17 of the PMOS region are completely removed to expose the pre high-k layer 15, inventive concepts are not limited thereto. The diffusion prevention layer 17 of the PMOS region may not be partially removed. In this case, the pre high-k layer 15 of the PMOS region may not be exposed.

Figure 14:
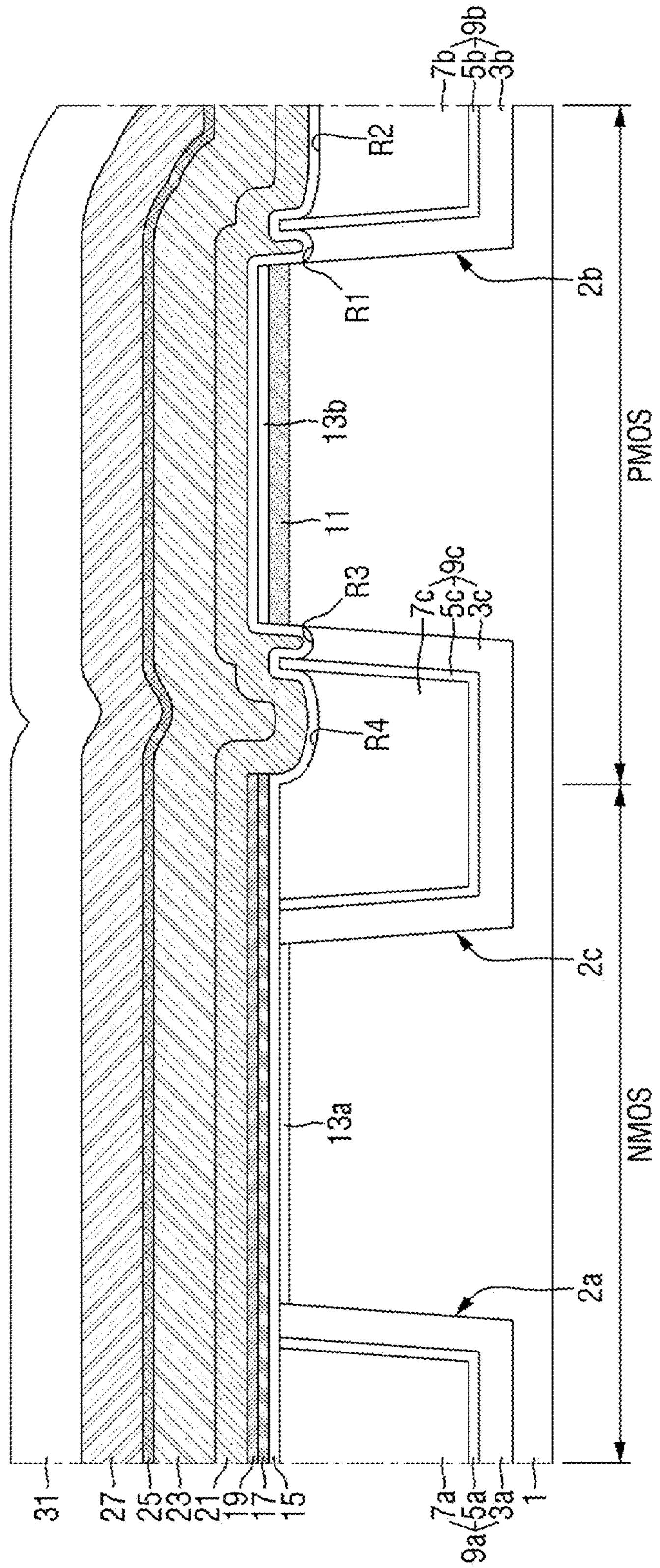

Referring to FIG. 14, the second mask layer MASK2 is removed. A conductive layer 21, a lower electrode layer 23, a middle electrode layer 25, an upper electrode layer 27, and a gate capping layer 31 are sequentially stacked on the front surface of the substrate 1.

The conductive layer 21 may include titanium nitride (TiN). The lower electrode layer 23 may include polysilicon doped with impurities such as phosphorus. After the polysilicon layer is deposited, an N-type impurity may be doped into the lower electrode layer 23 of the NMOS region, and a P-type impurity may be doped into the lower electrode layer 23 of the PMOS region. The lower electrode layer 23 may be doped with the same type of impurity in both the NMOS region and the PMOS region. For example, both the NMOS region and the PMOS region may be doped with an N-type impurity such as phosphorus and/or arsenic. For another example, both the NMOS region and the PMOS region may be doped with a P-type impurity such as boron. The middle electrode layer 25 may include TiSiN. The upper electrode layer 27 may include tungsten (W). The gate capping layer 31 may include silicon nitride (SiN).

Figure 15:
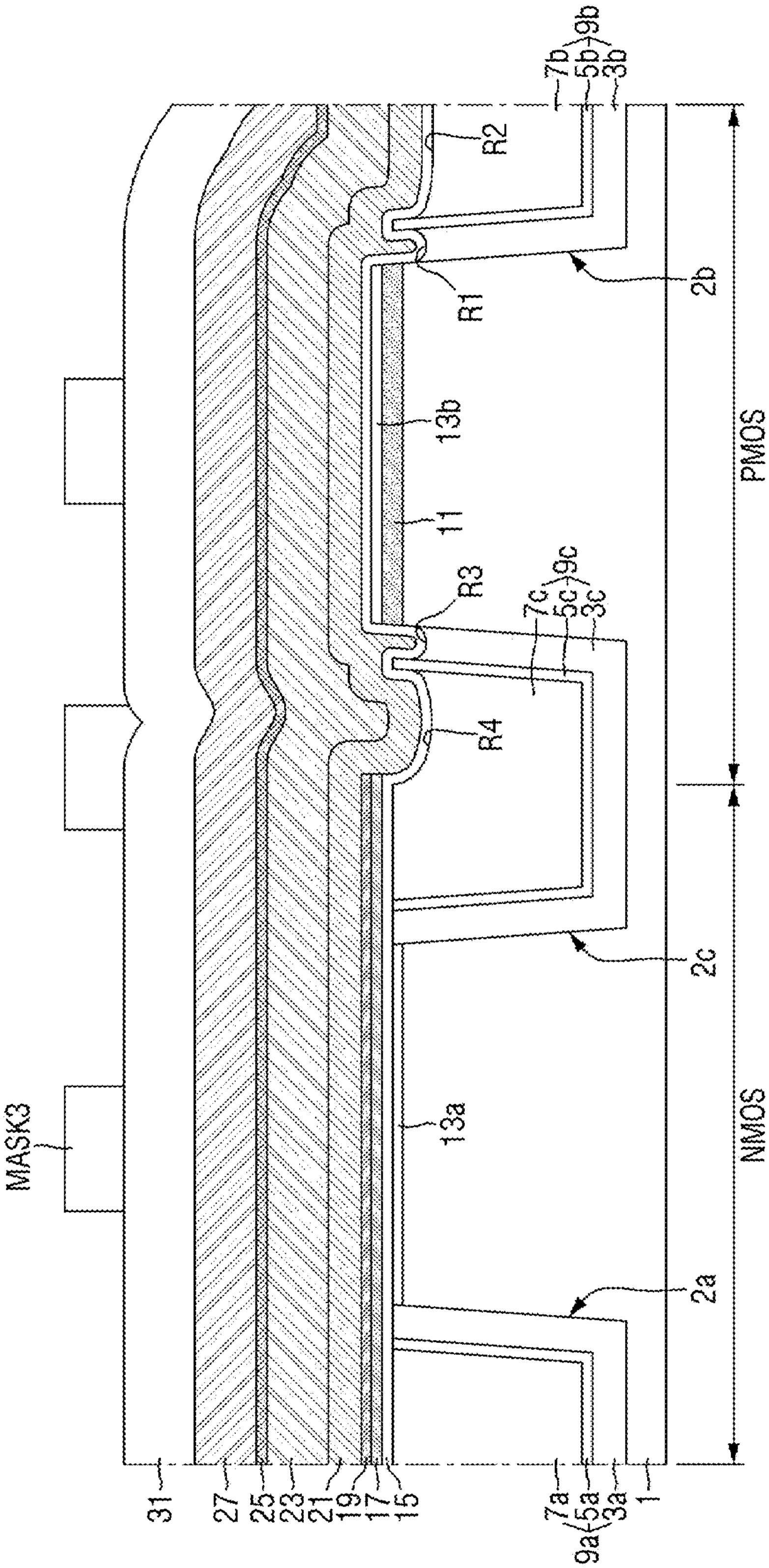

Referring to FIG. 15, a third mask layer MASK3 may be formed on the gate capping layer 31. The width of the third mask layer MASK3 may be the same as the width of the first gate pattern GP1, the second gate pattern GP2, and the dummy gate pattern GPc to be formed later. The third mask layer MASK3 may be formed of one or more of a photoresist layer, an amorphous carbon layer (ACL), a spin on hardmask (SOH), or a spin on carbon (SOC).

Figure 16:
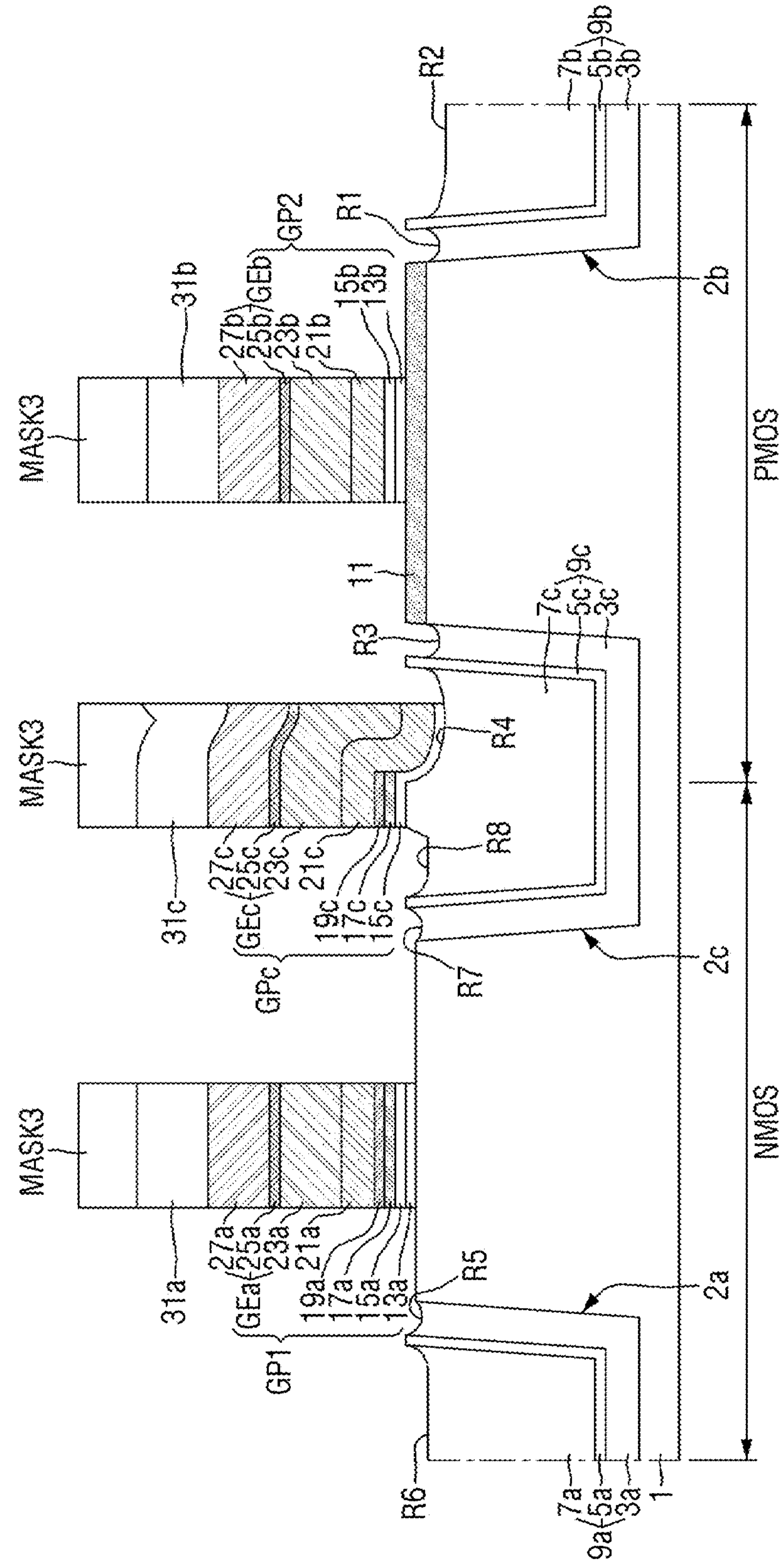

Referring to FIG. 16, in the NMOS region, the gate capping layer 31, the upper electrode layer 27, the middle electrode layer 25, the lower electrode layer 23, the conductive layer 21, the N-type work function layer 19, the diffusion prevention layer 17, and the pre high-k layer 15 may be continuously etched using the third mask layer MASK3 as an etching mask to form the first gate capping pattern 31*a* and the first gate pattern GP1.

In the PMOS region, the gate capping layer 31, the upper electrode layer 27, the middle electrode layer 25, the lower electrode layer 23, the conductive layer 21, and the pre high-k layer 15 may be continuously etched using the third mask layer MASK3 as an etching mask to form the second gate capping pattern 31*b* and the second gate pattern GP2.

At the boundary between the NMOS region and the PMOS region, the gate capping layer 31, the upper electrode layer 27, the middle electrode layer 25, the lower electrode layer 23, the conductive layer 21, the N-type work function layer 19, the diffusion prevention layer 17, and the pre high-k layer 15 may be continuously etched using the third mask layer MASK3 as an etching mask to form the dummy gate capping pattern 31*c* and the dummy gate pattern GPc.

The first gate pattern GP1, the second gate pattern GP2, and the dummy gate pattern GPc may be simultaneously or concurrently formed.

Since the first recess R1 and the third recess R3 are relatively narrow and deep, as the thickness of the layer existing in the first recess R1 and the third recess R3 is increased, it may be difficult to cleanly remove the layer in the etching process of FIG. 16. When the process of removing the diffusion prevention layer 17 and the N-type work function layer 19 of the PMOS region is not performed, the diffusion prevention layer 17 and the N-type work function layer 19 may be present in the first recess R1 and the third recess R3 in the PMOS region.

In this case, excessive etching may be required to remove the diffusion prevention layer 17 and the N-type work function layer 19 in the first recess R1 and the third recess R3 in the PMOS region. When excessive etching is required, the substrate 1 may also be damaged.

However, when the method of manufacturing the semiconductor memory device according to some example embodiments of inventive concepts is used, the diffusion prevention layer 17 and the N-type work function layer 19 in the PMOS region are removed in advance by a wet etching process, and thus in the etching process of FIG. 16 afterwards, the burden on the process may be reduced. Alternatively or additionally, the probability of residues remaining in the first recess R1 and the third recess R3 may be reduced. Accordingly, a semiconductor memory device having improved reliability may be realized.

Figure 17:
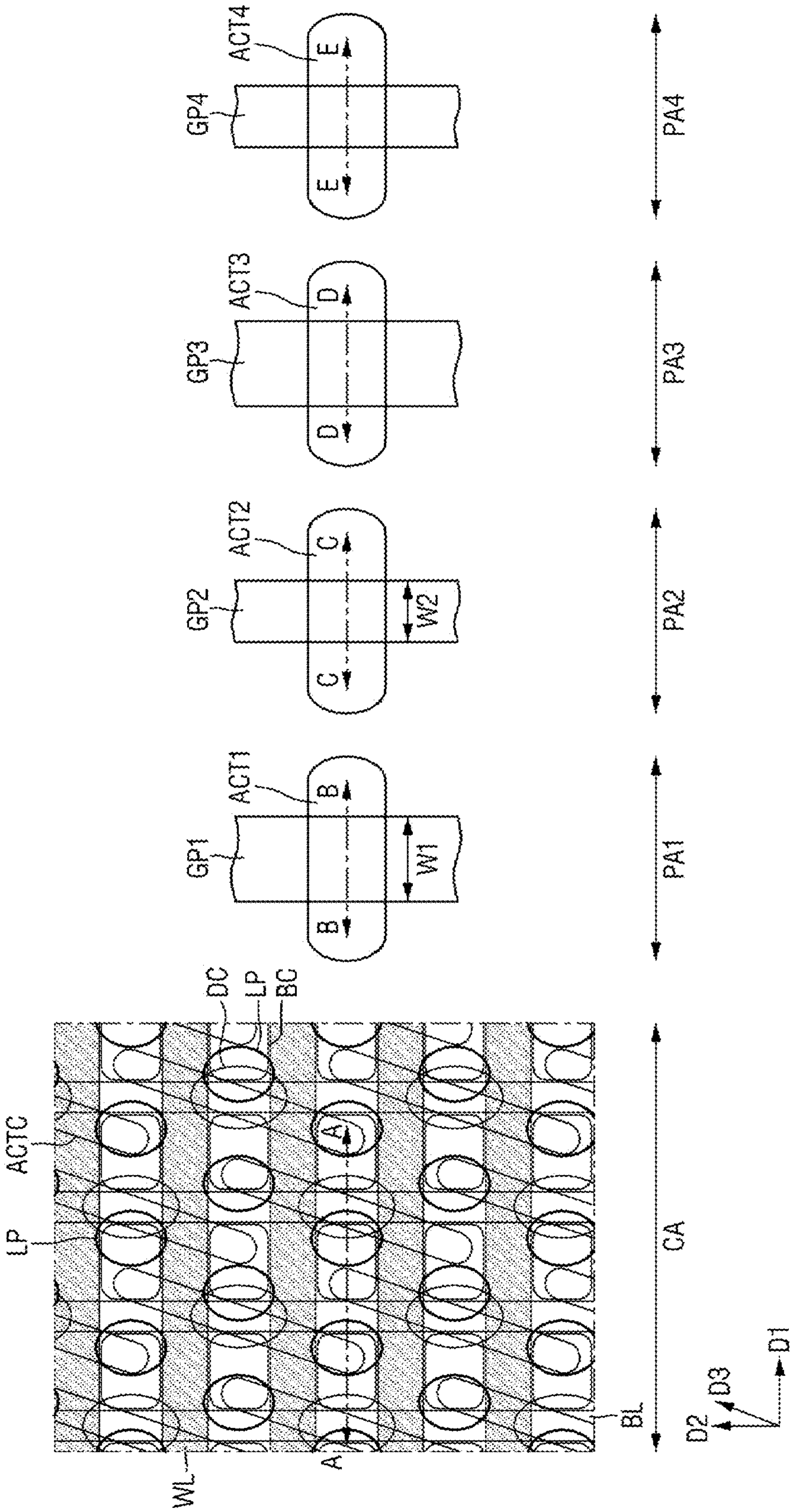
FIG. 17 is a plan view of a semiconductor memory device according to some example embodiments.
Figure 18:
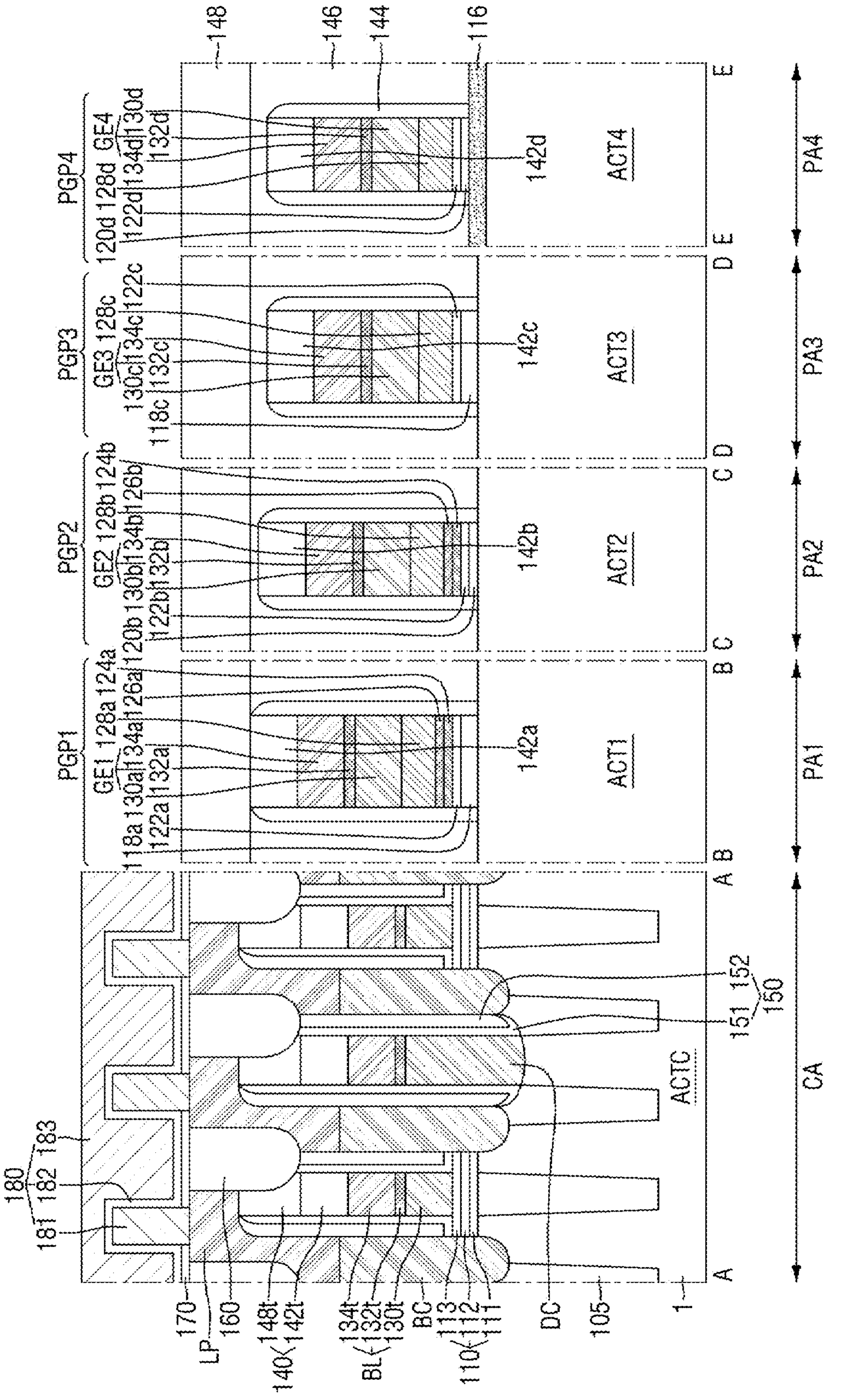
FIG. 18 is a cross-sectional view taken along lines A-A, B-B, C-C, D-D, and E-E of FIG. 17.

FIG. 17 is a plan view of a semiconductor memory device according to some example embodiments. FIG. 18 is a cross-sectional view taken along lines A-A, B-B, C-C, D-D, and E-E of FIG. 17. Hereinafter, a semiconductor memory device according to some example embodiments will be described with reference to FIGS. 17 and 18.

Referring to FIGS. 17 and 18, the substrate 1 including a cell array region CA, a first peripheral region PA1, a second peripheral region PA2, a third peripheral region PA3, and a fourth peripheral region PA4 is provided.

The first to fourth peripheral regions PA1, PA2, PA3, and PA4 may be disposed around the cell array region CA. In the first to fourth peripheral regions PA1, PA2, PA3, and PA4, word lines WL disposed in the cell array region CA and peripheral circuits for driving the bit lines BL may be disposed. For example, an NMOS high voltage transistor may be disposed in the first peripheral region PA1. An NMOS low voltage transistor may be disposed in the second peripheral region PA2. A PMOS high voltage transistor may be disposed in the third peripheral region PA3. A PMOS low voltage transistor may be disposed in the fourth peripheral region PA4. The first to fourth peripheral regions PA1, PA2, PA3, and PA4 may be sequentially disposed, but example embodiments are not limited thereto.

A cell element isolation layer 105 may be disposed in the substrate 1 of the cell array region CA. The cell element isolation layer 105 may define a cell active area ACTC. As the design rule of the semiconductor memory device is reduced, the cell active area ACTC may be disposed in a bar shape of a diagonal line and/or an oblique line as illustrated. For example, the cell active area ACTC may extend in the third direction D3.

The cell active areas ACTC may be arranged parallel to each other in the first direction D1. An end of one cell active area ACTC may be arranged to be adjacent to a center of another adjacent cell active area ACTC. Here, the first direction D1 and the second direction D2 may be perpendicular to each other. The third direction D3 may be an optional direction between the first direction D1 and the second direction D2.

The substrate 1 may be a single-crystal silicon or a polycrystalline substrate or an SDI substrate. The cell element isolation layer 105 may include an oxide liner, a nitride liner, and a buried insulating layer, as described with reference to FIG. 1.

The semiconductor memory device according to some example embodiments may include various contact arrangements formed on the cell active area ACTC. Various contact arrangements may include, for example, digitline contacts or direct contacts (DC), buried contacts (BC), landing pads (LP), and the like.

Here, a direct contact DC may mean a contact that electrically connects the cell active area ACTC to the bit line BL. The buried contact BC may refer to a contact connecting the cell active area ACTC to the capacitor lower electrode 181. Due to the disposition structure, a contact area between the buried contact BC and the cell active area ACTC may be small. Accordingly, the conductive landing pad LP may be introduced to increase the contact area with the capacitor lower electrode 181 along with increasing the contact area with the cell active area ACTC.

The landing pad LP may be disposed between the cell active area ACTC and the buried contact BC or may be disposed between the buried contact BC and the capacitor lower electrode 181. In the semiconductor memory device according to some example embodiments, the landing pad LP may be disposed between the buried contact BC and the capacitor lower electrode 181. By expanding the contact area through the introduction of the landing pad LP, the contact resistance between the cell active area ACTC and the capacitor lower electrode 181 may be reduced.

The word lines WL may be buried in or within the substrate 1. The word lines WL may cross the cell active area ACTC. The word lines WL may extend in the first direction D1. The word lines WL may be spaced apart from each other in the second direction D2. The word lines WL may be buried in the substrate 1 and extend in the first direction D1. Although not illustrated, a doped region may be formed in the cell active area ACTC between the word lines WL. The doped region may be doped with an N-type impurity such as at least one of arsenic or phosphorus.

A buffer layer 110 may be disposed on the substrate 1 of the cell array region CA. The buffer layer 110 may include a first cell insulating layer 111, a second cell insulating layer 112, and a third cell insulating layer 113, which are sequentially stacked. The second cell insulating layer 112 may include a material having an etch selectivity to the first cell insulating layer 111 and the third cell insulating layer 113. For example, the second cell insulating layer 112 may include silicon nitride, and may not include silicon oxide. The first and third cell insulating layers 111 and 113 may include silicon oxide, and may not include silicon nitride.

The bit lines BL may be disposed on the buffer layer 110. The bit lines BL may cross the substrate 1 and the word lines WL. As illustrated in FIG. 17, the bit lines BL may extend in the second direction D2. The bit lines BL may be spaced apart from each other in the first direction D1.

The bit lines BL may include a bit line lower electrode 130*t*, a bit line middle electrode 132*t*, and a bit line upper electrode 134*t*, which are sequentially stacked. The bit line lower electrode 130*t* may include polysilicon doped with impurities. The bit line middle electrode 132*t* may include TiSiN. The bit line upper electrode 134*t* may include tungsten (W). However, the technical spirit of inventive concepts are not limited thereto.

A bit line capping pattern 140 may be disposed on the bit line BL. The bit line capping pattern 140 may include a first bit line capping pattern 142*t* and a second bit line capping pattern 148*t*, which are sequentially stacked. Each of the first bit line capping pattern 142*t* and the second bit line capping pattern 148*t* may include silicon nitride.

A bit line spacer 150 may be disposed on the sidewall of the bit line BL and the sidewall of the bit line capping pattern 140. The bit line spacer 150 may be disposed on the substrate 1 and the cell element isolation layer 105 in a portion of the bit line BL in which the direct contact DC is formed. However, in a portion in which the direct contact DC is not formed, the bit line spacer 150 may be disposed on the buffer layer 110.

The bit line spacer 150 may be a single layer, but as illustrated, the bit line spacer 150 may be multiple layers including the first and second bit line spacers 151 and 152. For example, the first and second bit line spacers 151 and 152 may include one of a silicon oxide layer, a silicon nitride layer, a silicon oxynitride layer (SiON), a silicon oxycarbonitride layer (SiOCN), air such as clean, dry air, and combinations thereof, but is not limited thereto.

The buffer layer 110 may be interposed between the bit line BL and the cell element isolation layer 105 and between the bit line spacer 150 and the substrate 1.

The bit line BL may be electrically connected to the doped region of the cell active area ACTC by the direct contact DC. The direct contact DC may be formed of, for example, polysilicon doped with impurities.

The buried contact BC may be disposed between a pair of adjacent bit lines BL. The buried contacts BC may be spaced apart from each other. The buried contact BC may include at least one of polysilicon doped with impurities, a conductive silicide compound, a conductive metal nitride, or a metal. The buried contacts BC may have a shape of islands that are spaced apart from each other in plan view. The buried contact BC may pass through the buffer layer 110 to be in contact with the doped regions of the cell active area ACTC.

The landing pad LP may be formed on the buried contact BC. The landing pad LP may be electrically connected to the buried contact BC. The landing pad LP may overlap a part of the top surface of the bit line BL. The landing pad LP may include, for example, at least one of a semiconductor material doped with impurities, a conductive silicide compound, a conductive metal nitride, a conductive metal carbide, a metal, and a metal alloy.

A pad separation insulating layer 160 may be formed on the landing pad LP and the bit line BL. For example, the pad separation insulating layer 160 may be disposed on the bit line capping pattern 140. The pad separation insulating layer 160 may define an area of the landing pad LP forming a plurality of separated areas. In addition, the pad separation insulating layer 160 may not cover the top surface of the landing pad LP.

The pad separation insulating layer 160 may include an insulating material to electrically separate the plurality of landing pads LP from each other. For example, the pad separation insulating layer 160 may include, for example, at least one of a silicon oxide layer, a silicon nitride layer, a silicon oxynitride layer, a silicon oxycarbonitride layer, or a silicon carbonitride layer.

An etch stop layer 170 may be disposed on the pad separation insulating layer 160 and the landing pad LP. The etch stop layer 170 may include at least one of a silicon nitride layer, a silicon carbonitride layer, a silicon boron nitride layer (SiBN), a silicon oxynitride layer, and a silicon oxycarbide layer.

A memory component such as a memristor and/or a capacitor 180 may be disposed on the landing pad LP. The capacitor 180 may be electrically connected to the landing pad LP. A part of the capacitor 180 may be disposed in the etch stop layer 170. The capacitor 180 includes a capacitor lower electrode 181, a capacitor dielectric layer 182, and a capacitor upper electrode 183.

The capacitor lower electrode 181 may be disposed on the landing pad LP. The capacitor lower electrode 181 is illustrated as having a pillar shape, but is not limited thereto. Of course, the capacitor lower electrode 181 may have a cylindrical shape. The capacitor dielectric layer 182 is formed on the capacitor lower electrode 181. The capacitor dielectric layer 182 may be formed along a profile of the capacitor lower electrode 181. The capacitor upper electrode 183 is formed on the capacitor dielectric layer 182. The capacitor upper electrode 183 may surround an outer wall of the capacitor lower electrode 181.

As one example, the capacitor dielectric layer 182 may be disposed at a portion vertically overlapping the capacitor upper electrode 183. For another example, unlike as in the drawing, the capacitor dielectric layer 182 may include a first portion vertically overlapping the capacitor upper electrode 183 and a second portion not vertically overlapping the capacitor upper electrode 183. For example, the second portion of the capacitor dielectric layer 182 is a portion that is not covered by the capacitor upper electrode 183.

Each of the capacitor lower electrode 181 and the capacitor upper electrode 183 may include, for example, a doped semiconductor material, conductive metal nitride (e.g., titanium nitride, tantalum nitride, niobium nitride, tungsten nitride, or the like), metal (e.g., ruthenium, iridium, titanium, tantalum, or the like), conductive metal oxide (e.g., iridium oxide, niobium oxide, or the like), or the like, but inventive concepts are not limited thereto.

The capacitor dielectric layer 182 may include, for example, silicon oxide, silicon nitride, silicon oxynitride, a high-k material, and a combination thereof, but is not limited thereto. In the semiconductor memory device according to some example embodiments, the capacitor dielectric layer 182 may include a stacked structure in which zirconium oxide, aluminum oxide and zirconium oxide are sequentially stacked. In the semiconductor memory device according to some example embodiments, the capacitor dielectric layer 182 may include a dielectric layer including hafnium (Hf). In the semiconductor memory device according to some example embodiments, the capacitor dielectric layer 182 may have a stacked structure including a ferroelectric material layer and a paraelectric material layer.

Although not illustrated, in the first peripheral region PA1, a first peripheral active area ACT1 may be defined by a peripheral element isolation layer. A first peripheral gate pattern PGP1 is disposed on the substrate 1 in the first peripheral region PAL The first peripheral gate pattern PGP1 may include a first peripheral insulating layer 118*a*, a first peripheral high-k layer 122*a*, a first peripheral diffusion prevention pattern 124*a*, a first peripheral N-type work function pattern 126*a*, a first peripheral conductive pattern 128*a*, and a first peripheral gate electrode GE1, which are sequentially stacked on the substrate 1. A first peripheral gate capping pattern 142*a* may be disposed on the first peripheral gate pattern PGP1.

Although not illustrated, in the second peripheral region PA2, the second peripheral active area ACT2 may be defined by the peripheral element isolation layer. A second peripheral gate pattern PGP2 is disposed on the substrate 1 in the second peripheral region PA2. The second peripheral gate pattern PGP2 may include a second peripheral insulating layer 120*b*, a second peripheral high-k layer 122*b*, a second peripheral diffusion prevention pattern 124*b*, a second peripheral N-type work function pattern 126*b*, a second peripheral conductive pattern 128*b*, and a second peripheral gate electrode GE2, which are sequentially stacked on the substrate 1. A second peripheral gate capping pattern 142*b* may be disposed on the second peripheral gate pattern PGP2.

Although not illustrated, in the third peripheral region PA3, a third peripheral active area ACT5 may be defined by a peripheral element isolation layer. A third peripheral gate pattern PGP3 is disposed on the substrate 1 of the third peripheral region PA3. The third peripheral gate pattern PGP3 may include a third peripheral insulating layer 118*c*, a third peripheral high-k layer 122*c*, a third peripheral conductive pattern 128*c*, and a third peripheral gate electrode GE3, which are sequentially stacked on the substrate 1. A third peripheral gate capping pattern 142*c* may be disposed on the third peripheral gate pattern PGP3. The third peripheral gate pattern PGP3 may not include a diffusion prevention pattern and an N-type work function pattern.

Although not illustrated, in the fourth peripheral region PA4, a fourth peripheral active area ACT4 may be defined by a peripheral element isolation layer. A channel layer 116 may be disposed on the substrate 1 in the fourth peripheral region PA4. The lattice constant of the channel layer 116 may be greater than the lattice constant of the substrate 1. The channel layer 116 may include, for example, silicon germanium, while the substrate may include single-crystal silicon. A fourth peripheral gate pattern PGP4 is disposed on the channel layer 116.

The fourth peripheral gate pattern PGP4 may include a fourth peripheral insulating layer 120*d*, a fourth peripheral high-k layer 122*d*, a fourth peripheral conductive pattern 128*d*, and a fourth peripheral gate electrode GE4, which are sequentially stacked on the channel layer 116. A fourth peripheral gate capping pattern 142*d* may be disposed on the fourth peripheral gate pattern PGP4. The fourth peripheral gate pattern PGP4 may not include a diffusion prevention pattern and an N-type work function pattern.

In FIG. 17, a width W1 of the first peripheral gate pattern GP1 may be greater than a width W2 of the second peripheral gate pattern GP2. A width of the third peripheral gate pattern GP3 may be the same as the width W1 of the first peripheral gate pattern GP1. A width of the fourth peripheral gate pattern GP4 may be the same as the width W2 of the second peripheral gate pattern GP2. For example, the width W1 of the third peripheral gate pattern GP3 may be greater than the width W2 of the fourth peripheral gate pattern GP4.

In FIG. 18, the first peripheral insulating layer 118*a* may be thicker than the second peripheral insulating layer 120*b*. The third peripheral insulating layer 118*c* may be thicker than the fourth peripheral insulating layer 120*d*. A high voltage transistor may be disposed in the first peripheral region PA1 and the third peripheral region PA3, and a low voltage transistor may be disposed in the second peripheral region PA2 and the fourth peripheral region PA4. Accordingly, the first peripheral insulating layer 118*a* of the first peripheral region PA1 and the third peripheral insulating layer 118*c* of the third peripheral region PA3 may be thicker than the second peripheral insulating layer 120*b* of the second peripheral region PA2 and the fourth peripheral insulating layer 120*d* of the fourth peripheral region PA4, respectively.

Each of the first to fourth peripheral insulating layers 118*a*, 120*b*, 118*c*, and 120*d* may include silicon oxide.

Each of the first to fourth peripheral high-k layers 122*a*, 122*b*, 122*c*, and 122*d* may include, for example, at least one of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or a combination thereof.

Each of the first peripheral diffusion prevention pattern 124*a* and the second peripheral diffusion prevention pattern 124*b* may include titanium nitride (TiN). Each of the first peripheral diffusion prevention pattern 124*a* and the second peripheral diffusion prevention pattern 124*b* may be a single layer, but is not limited thereto.

Although not illustrated, the first peripheral gate pattern PGP1 may further include a first lower peripheral boundary pattern disposed between the first peripheral diffusion prevention pattern 124*a* and the first peripheral N-type work function pattern 126*a*. The second peripheral gate pattern PGP2 may further include a second lower peripheral boundary pattern disposed between the second peripheral diffusion prevention pattern 124*b* and the second peripheral N-type work function pattern 126*b*.

Alternatively or additionally, the first peripheral gate pattern PGP1 may further include a first upper peripheral boundary pattern disposed between the first peripheral N-type work function pattern 126*a* and the first peripheral conductive pattern 128*a*. The second peripheral gate pattern PGP2 may further include a second upper peripheral boundary pattern disposed between the second peripheral N-type work function pattern 126*b* and the second peripheral conductive pattern 128*b*.

Each of the first and second lower peripheral boundary patterns and the first and second upper peripheral boundary patterns may include lanthanum titanium nitride (LaTiN) or lanthanum titanium oxynitride (LaTiNO), but are not limited thereto.

Each of the first peripheral diffusion prevention pattern 124*a* and the second peripheral diffusion prevention pattern 124*b* may prevent, or reduce the likelihood of and/or impact from, the diffusion of lanthanum (La) included in the first peripheral N-type work function pattern 126*a* and the second peripheral N-type work function pattern 126*b*.

Each of the first peripheral N-type work function pattern 126*a* and the second peripheral N-type work function pattern 126*b* may include, for example, at least one of lanthanum (La), lanthanum oxide (LaO), magnesium (Mg), magnesium oxide (MgO), tantalum (Ta), tantalum nitride (TaN), or niobium (Nb).

Each of the first to fourth peripheral conductive patterns 128*a*, 128*b*, 128*c*, and 128*d* may include titanium nitride (TiN), aluminum (Al), or a combination thereof.

Each of the first to fourth peripheral gate capping patterns 142*a*, 142*b*, 142*c*, and 142*d* may include silicon nitride.

In some example embodiments, the first to fourth peripheral conductive patterns 128*a*, 128*b*, 128*c*, and 128*d* may all have the same thickness. However, the technical spirit of inventive concepts is not limited thereto. The thickness of the first and second peripheral conductive patterns 128*a* and 128*b* may be smaller than the thickness of the third and fourth peripheral conductive patterns 128*c* and 128*d*.

The first to fourth peripheral gate capping patterns 142*a*, 142*b*, 142*c*, and 142*d* may have the same thickness as the first bit line capping pattern 142*t*. The bit line capping pattern 140 may further include the second bit line capping pattern 148*t*. Accordingly, the thickness of the first to fourth peripheral gate capping patterns 142*a*, 142*b*, 142*c*, and 142*d* may be smaller than the thickness of the bit line capping pattern 140.

The first peripheral gate electrode GE1 includes a first peripheral lower electrode 130*a*, a first peripheral middle electrode 132*a*, and a first peripheral upper electrode 134*a*, which are sequentially stacked. The second peripheral gate electrode GE2 includes a second peripheral lower electrode 130*b*, a second peripheral middle electrode 132*b*, and a second peripheral upper electrode 134*b*, which are sequentially stacked. The third peripheral gate electrode GE3 includes a third peripheral lower electrode 130*c*, a third peripheral middle electrode 132*c*, and a third peripheral upper electrode 134*c*, which are sequentially stacked. The fourth peripheral gate electrode GE4 includes a fourth peripheral lower electrode 130*d*, a fourth peripheral middle electrode 132*d*, and a fourth peripheral upper electrode 134*d*, which are sequentially stacked.

Each of the first to fourth peripheral lower electrodes 130*a*, 130*b*, 130*c*, and 130*d* may include polysilicon doped with impurities. The conductivity types of the impurities doped into the first and second peripheral lower electrodes 130*a* and 130*b* may be different from the conductivity types of the impurities doped into the third and fourth peripheral lower electrodes 130*c* and 130*d*. For example, the first and second peripheral lower electrodes 130*a* and 130*b* may be doped with N-type impurities, and the third and fourth peripheral lower electrodes 130*c* and 130*d* may be doped with P-type impurities. Each of the first to fourth peripheral middle electrodes 132*a*, 132*b*, 132*c*, and 132*d* may include TiSiN. Each of the first to fourth peripheral upper electrodes 134*a*, 134*b*, 134*c*, and 134*d* may include tungsten. However, the technical spirit of inventive concepts is not limited thereto.

In some example embodiments, the bit line BL and the first to fourth peripheral gate electrodes GE1, GE2, GE3, and GE4 may have the same stacked structure.

For example, the bit line lower electrode 130*t*, the first peripheral lower electrode 130*a*, the second peripheral lower electrode 130*b*, the third peripheral lower electrode 130*c*, and the fourth peripheral lower electrode 130*d* have the same thickness. In addition, the bit line middle electrode 132*t*, the first peripheral middle electrode 132*a*, the second peripheral middle electrode 132*b*, the third peripheral middle electrode 132*c*, and the fourth peripheral middle electrode 132*d* have the same thickness. The bit line upper electrode 134*t*, the first peripheral upper electrode 134*a*, the second peripheral upper electrode 134*b*, the third peripheral upper electrode 134*c*, and the fourth peripheral upper electrode 134*d* have the same thickness.

Sidewalls of the first to fourth peripheral gate patterns PGP1, PGP2, PGP3, and PGP4 may be covered with peripheral spacers 144. Sidewalls of the peripheral spacer 144 and the substrate 1 may be covered with a peripheral interlayer insulating layer 146. The peripheral interlayer insulating layer 146 may include, for example, silicon oxide. A second capping layer 148 may be disposed on the peripheral interlayer insulating layer 146. The second capping layer 148 may serve as an etch stop layer. The second capping layer 148 may be formed of a material different from the material of the peripheral interlayer insulating layer 146. For example, the second capping layer 148 may include silicon nitride. The thickness of the second capping layer 148 may be substantially the same as the thickness of the second bit line capping pattern 148*t*.

FIGS. 19 to 34 are cross-sectional views sequentially illustrating a process of manufacturing the semiconductor memory device having the cross sections of FIG. 18. Hereinafter, a method of manufacturing a semiconductor memory device according to some example embodiments of inventive concepts will be described.

Figure 19:
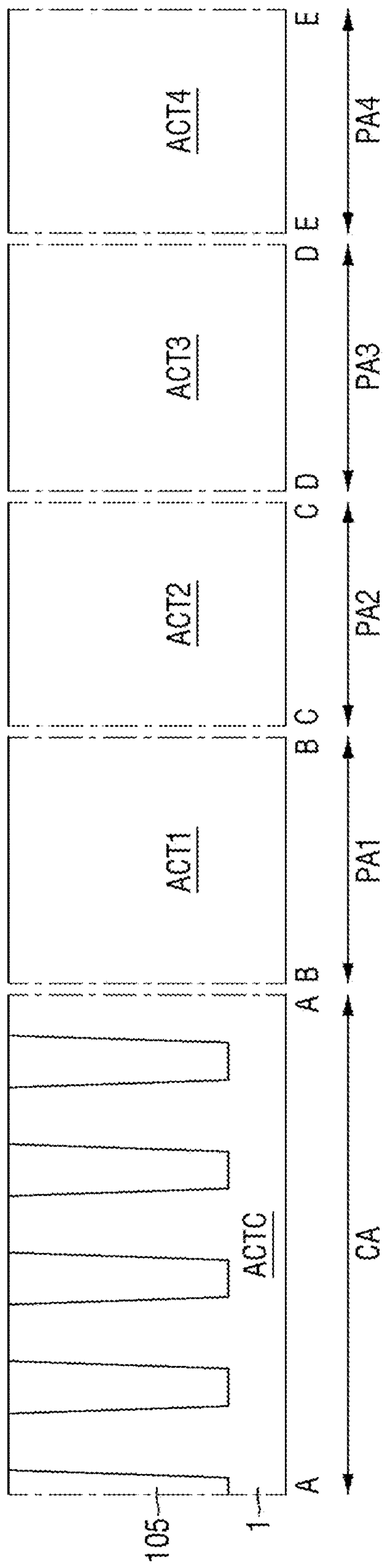
FIGS. 19 to 34 are cross-sectional views sequentially illustrating a process of manufacturing the semiconductor memory device having the cross sections of FIG. 18.

Referring to FIGS. 17 and 19, the substrate 1 including the cell array region CA, the first peripheral region PA1, the second peripheral region PA2, the third peripheral region PA3, and the fourth peripheral region PA4 is provided.

The cell element isolation layer 105 and the peripheral element isolation layer may be formed in the substrate 1 to form the cell active area ACTC and the first to fourth peripheral active areas ACT1, ACT2, ACT3, and ACT4. The cell element isolation layer 105 and the peripheral element isolation layer may define the cell active area ACTC and the first to fourth peripheral active areas ACT1, ACT2, ACT3, and ACT4.

In the cell array region CA, the word line WL may be formed. The word line WL may be buried in the substrate 1 and extend in the first direction D1. In the cell array region CA, an ion implantation process may be performed to form a doped region in the cell active area ACTC. During the ion implantation process, the first to fourth peripheral regions PA1, PA2, PA3, and PA4 may be covered with a mask.

Figure 20:
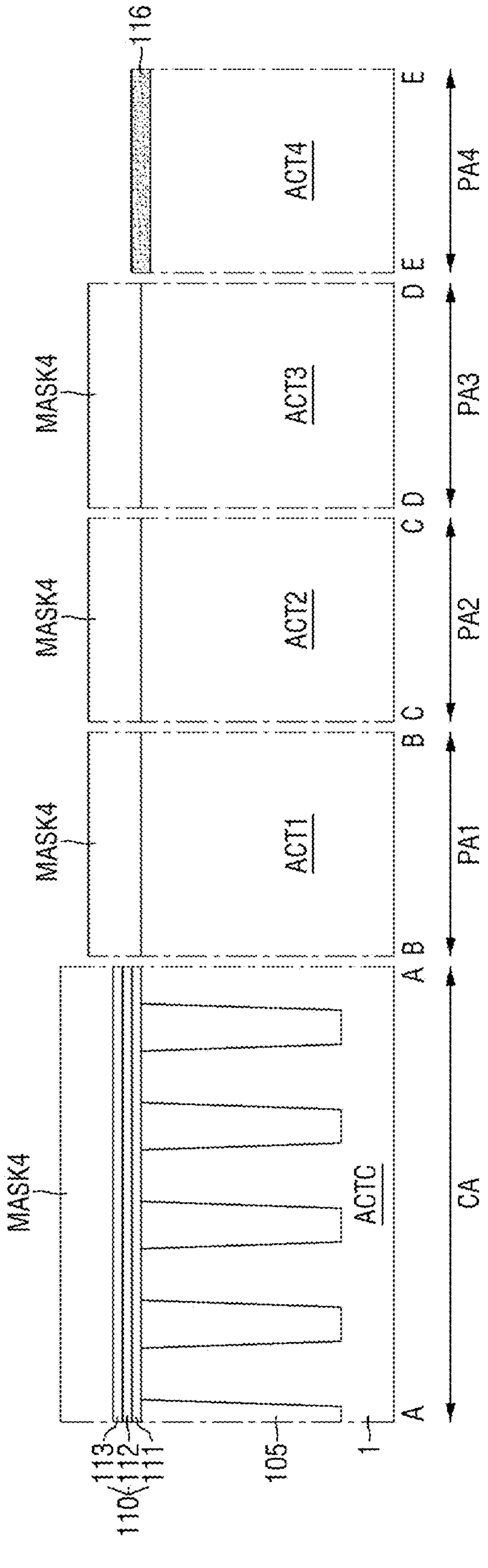

Referring to FIG. 20, the first to fourth peripheral regions PA1, PA2, PA3, and PA4 may be covered with a mask. Subsequently, the first cell insulating layer 111, the second cell insulating layer 112, and the third cell insulating layer 113 may be sequentially stacked and patterned on the substrate 1 of the cell array region CA to form the buffer layer 110 on the cell array region CA.

Subsequently, the first to fourth peripheral regions PA1, PA2, PA3, and PA4 may be exposed. A fourth mask layer MASK4 covering the cell array region CA and the first to third peripheral regions PA1, PA2, and PA3 and exposing the fourth peripheral region PA4 may be formed on the substrate 1. The fourth mask layer MASK4 may include, for example, silicon oxide. The fourth mask layer MASK4 may correspond to the first mask layer MASK1 of FIG. 10.

The channel layer 116 may be formed on the substrate 1 of the fourth peripheral region PA4 by using the fourth mask layer MASK4 as an epitaxial barrier layer. The channel layer 116 may include silicon germanium. The channel layer 116 may be formed by a selective epitaxial growth (SEG) method.

Figure 21:
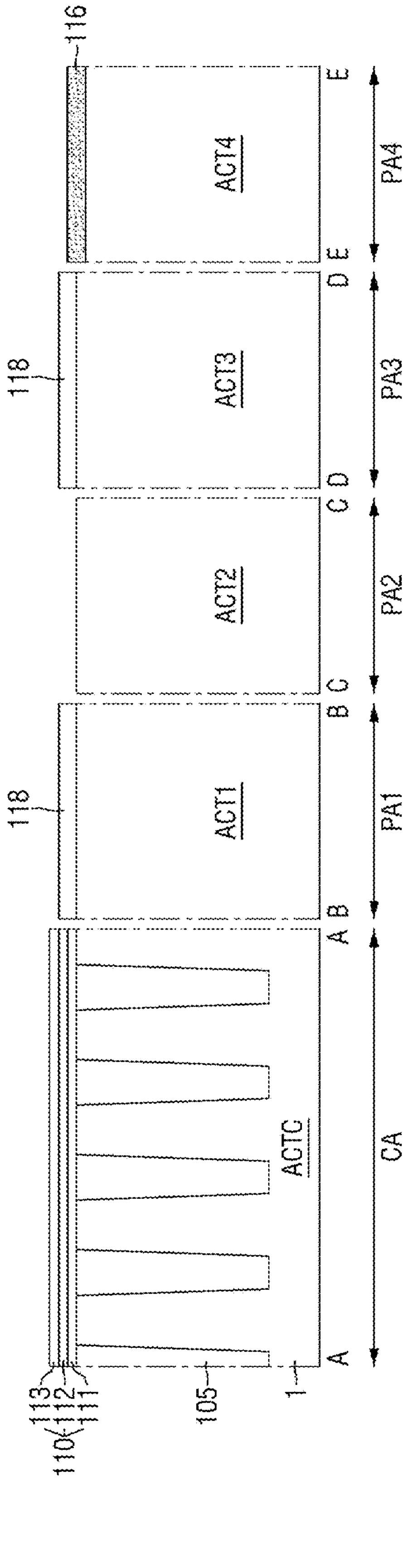

Referring to FIG. 21, the fourth mask layer MASK4 may be removed to expose the top surface of the buffer layer 110 of the cell array region CA and the first to third peripheral regions PA1, PA2, and PA3.

Subsequently, although not illustrated, a separate mask may be used to cover the cell array region CA and the second and fourth peripheral regions PA2 and PA4. A high voltage gate insulating layer 118 may be formed on the substrate 1 of the first peripheral region PA1 and the third peripheral region PA3 that are open. The high voltage gate insulating layer 118 may be formed of a silicon oxide layer.

Figure 22:
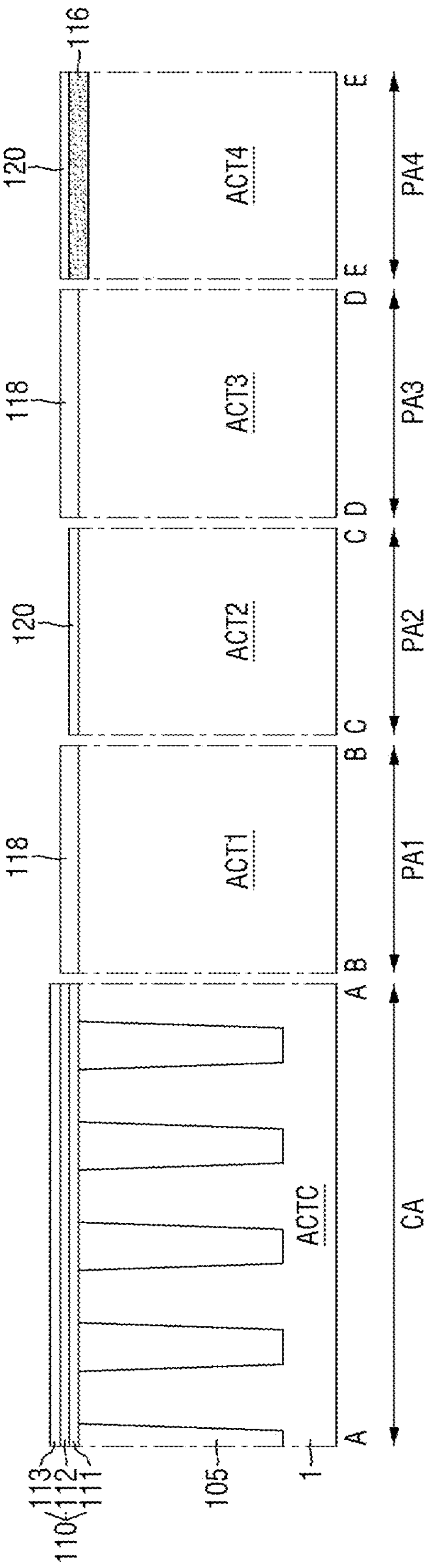

Referring to FIG. 22, a separate mask may be used to cover the cell array region CA and the first and third peripheral regions PA1 and PA3, and a low voltage gate insulating layer 120 may be formed on the substrate 1 of the second peripheral region PA2 and the channel layer 116 of the fourth peripheral region PA4. The low voltage gate insulating layer 120 may be formed of, for example, a silicon oxide layer. The low voltage gate insulating layer 120 may be formed thinner than the high voltage gate insulating layer 118.

Figure 23:
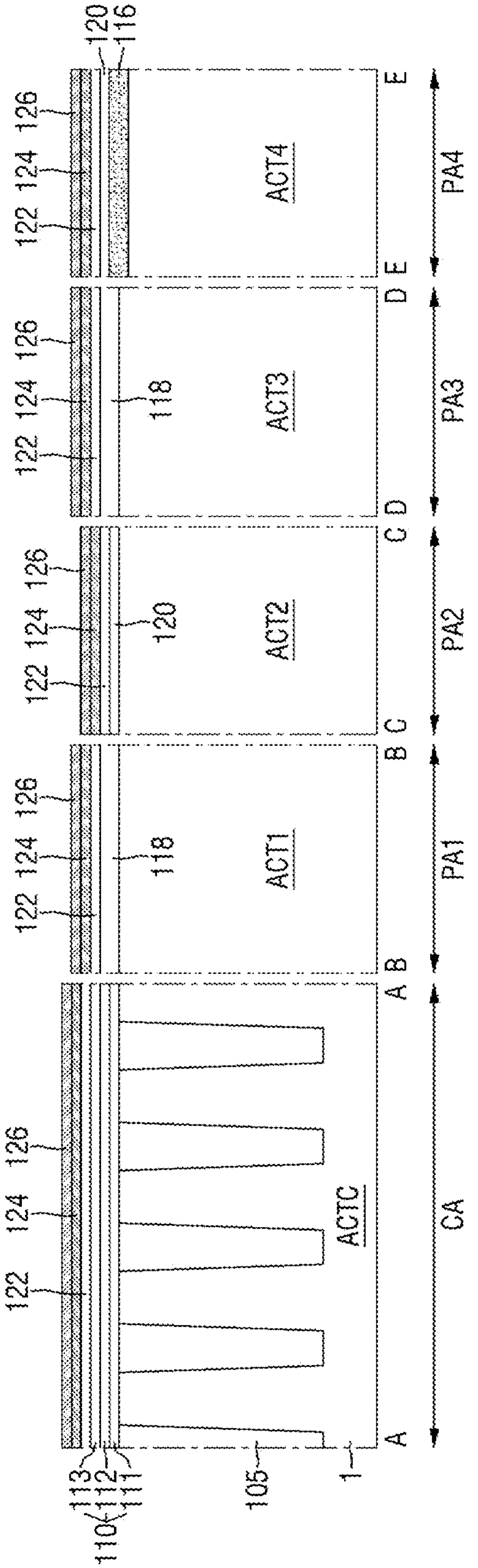

Referring to FIG. 23, a pre high-k layer 122, a diffusion prevention layer 124, and an N-type work function layer 126 may be sequentially formed on the front surface of the substrate 1.

The pre high-k layer 122, the diffusion prevention layer 124, and the N-type work function layer 126 may correspond to the pre high-k layer 15, the diffusion prevention layer 17, and the N-type work function layer 19 of FIG. 12, respectively.

The pre high-k layer 122 may be formed by a deposition process such as chemical vapor deposition (CVD) and/or atomic layer deposition (ALD). The pre high-k layer 122 may include a material having a higher dielectric constant than the first to fourth peripheral insulating layers 118*a*, 120*b*, 118*c*, and 120*d*. For example, the pre high-k layer 122 may include hafnium oxide, but is not limited thereto.

The diffusion prevention layer 124 may include, for example, titanium nitride (TiN). The N-type work function layer 126 may include, for example, at least one of lanthanum (La), lanthanum oxide (LaO), magnesium (Mg), magnesium oxide (MgO), tantalum (Ta), tantalum nitride (TaN), or niobium (Nb). However, the technical spirit of inventive concepts is not limited thereto.

Figure 24:
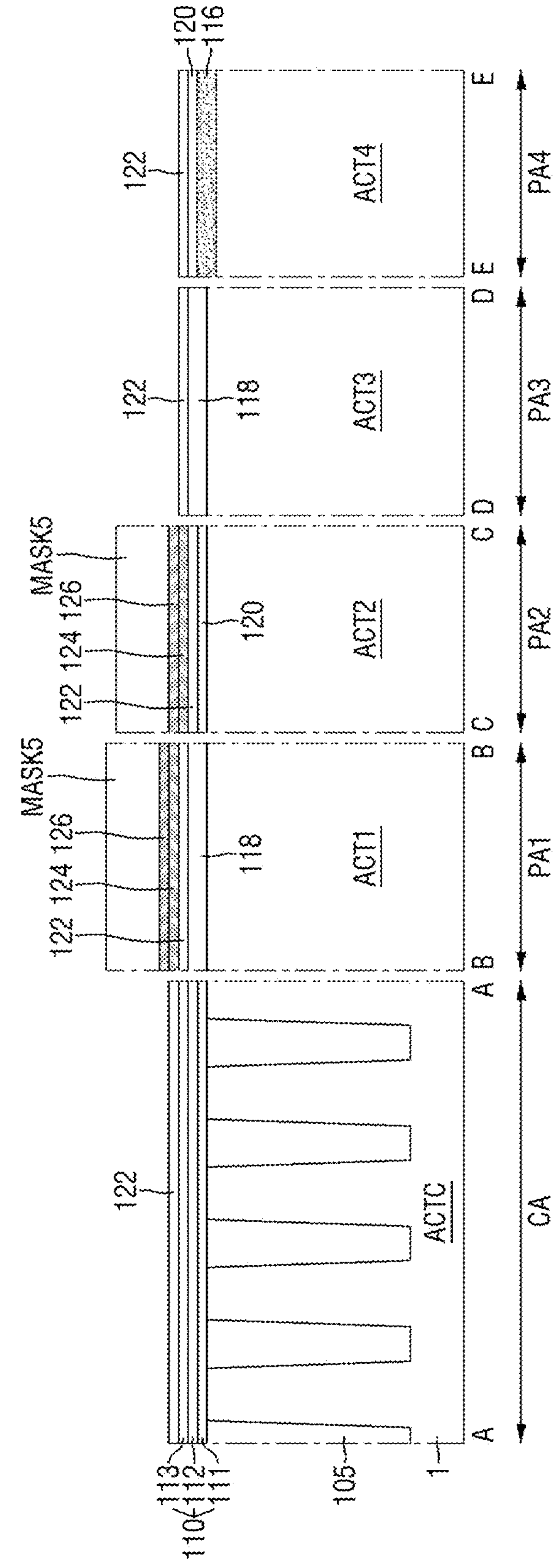

Referring to FIG. 24, a fifth mask layer MASK5 covering the first peripheral region PA1 and the second peripheral region PA2 and exposing the cell array region CA, the third peripheral region PA3, and the fourth peripheral region PA4, may be formed. The fifth mask layer MASK5 may be at least one of a photoresist layer, ACL, SOH, SOC, or a silicon nitride layer.

Subsequently, an etching process may be performed using the fifth mask layer MASK5 as an etching mask. Through the etching process, the N-type work function layer 126 and the diffusion prevention layer 124 of the cell array region CA, the third peripheral region PA3, and the fourth peripheral region PA4 may be removed. The etching process may be a wet etching process using an etchant containing sulfuric acid. The N-type work function layer 126 and the diffusion prevention layer 124 may be selectively removed by performing a wet etching process. The N-type work function layer 126 and the diffusion prevention layer 124 may be selectively formed in the first peripheral region PA1 and the second peripheral region PA2.

Figure 25:
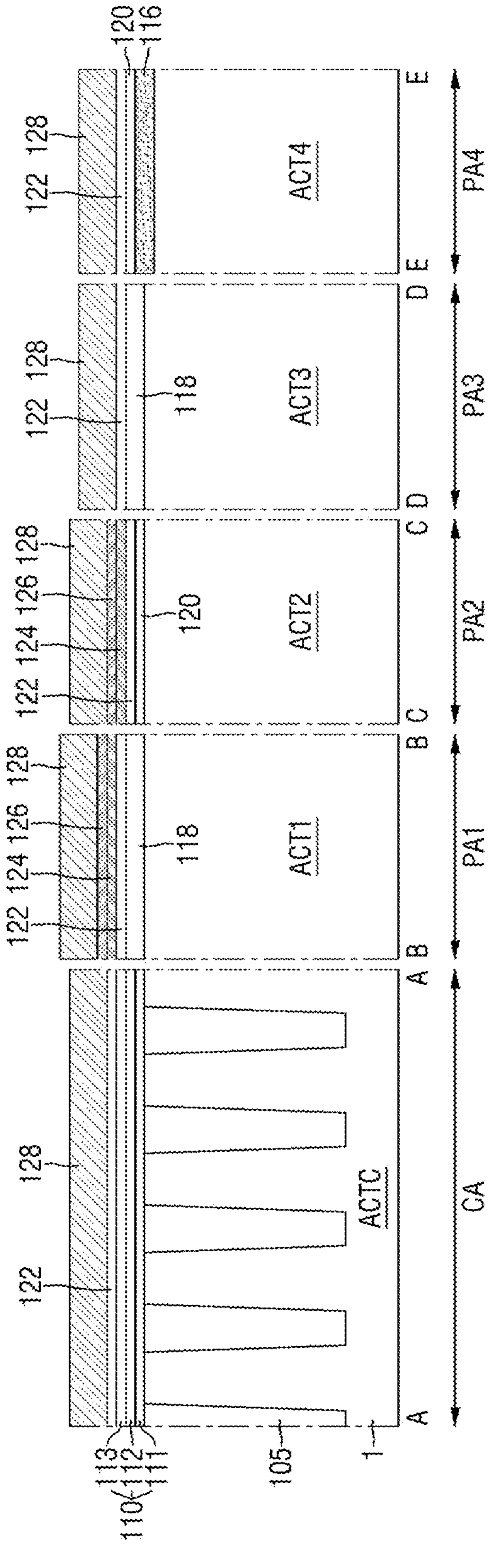

Referring to FIG. 25, the fifth mask layer MASK5 may be removed. The cell array region CA and the first to fourth peripheral regions PA1, PA2, PA3, and PA4 may be exposed.

A conductive layer 128 may be formed on the substrate 1 of the cell array region CA and the first to fourth peripheral regions PA1, PA2, PA3, and PA4. The conductive layer 128 may include, for example, titanium nitride (TiN), aluminum (Al), or a combination thereof, but is not limited thereto.

Figure 26:
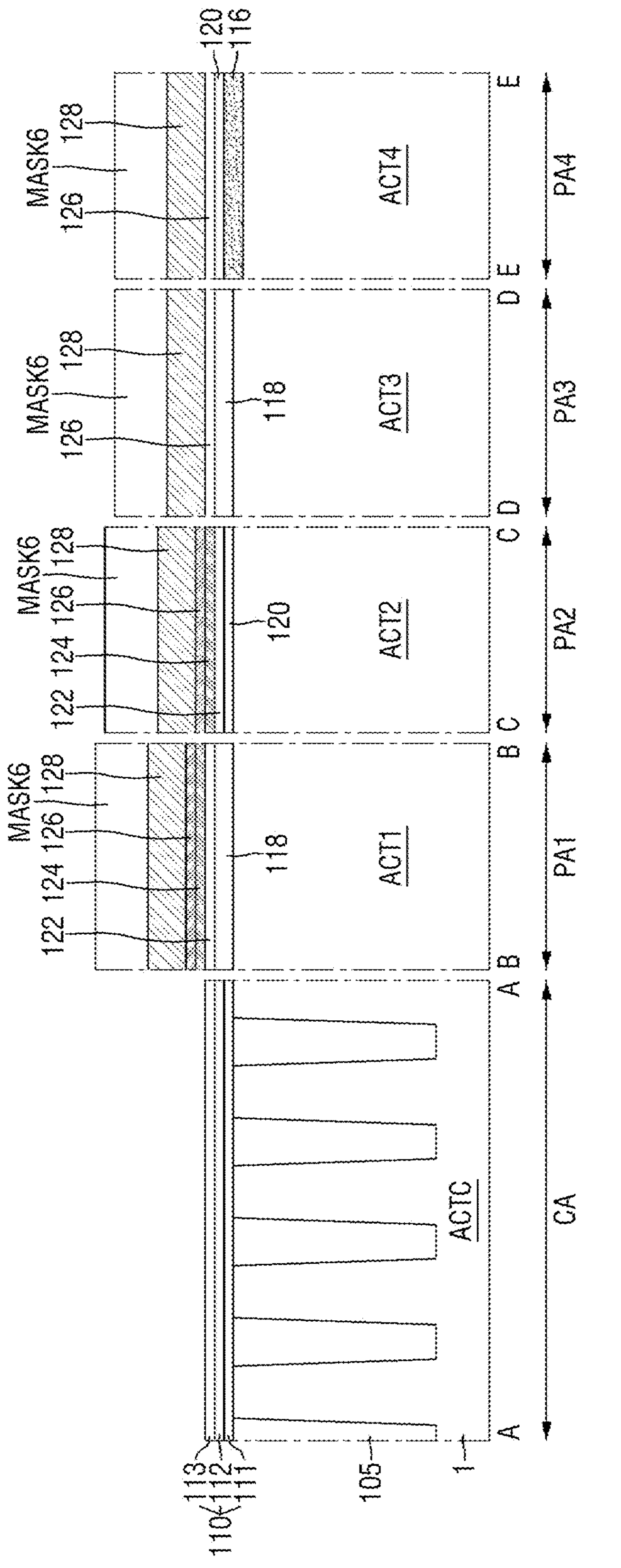

Referring to FIG. 26, a sixth mask layer MASK6 covering the first to fourth peripheral regions PA1, PA2, PA3, and PA4 and exposing the cell array region CA may be formed.

The conductive layer 128 and the pre high-k layer 122 of the cell array region CA may be removed by performing an etching process using the sixth mask layer MASK6 as an etching mask. The etching process may be a wet etching process using an etchant containing sulfuric acid. The conductive layer 128 and the pre high-k layer 122 may be selectively removed without damage to the buffer layer 110 by performing a wet etching process.

Figure 27:
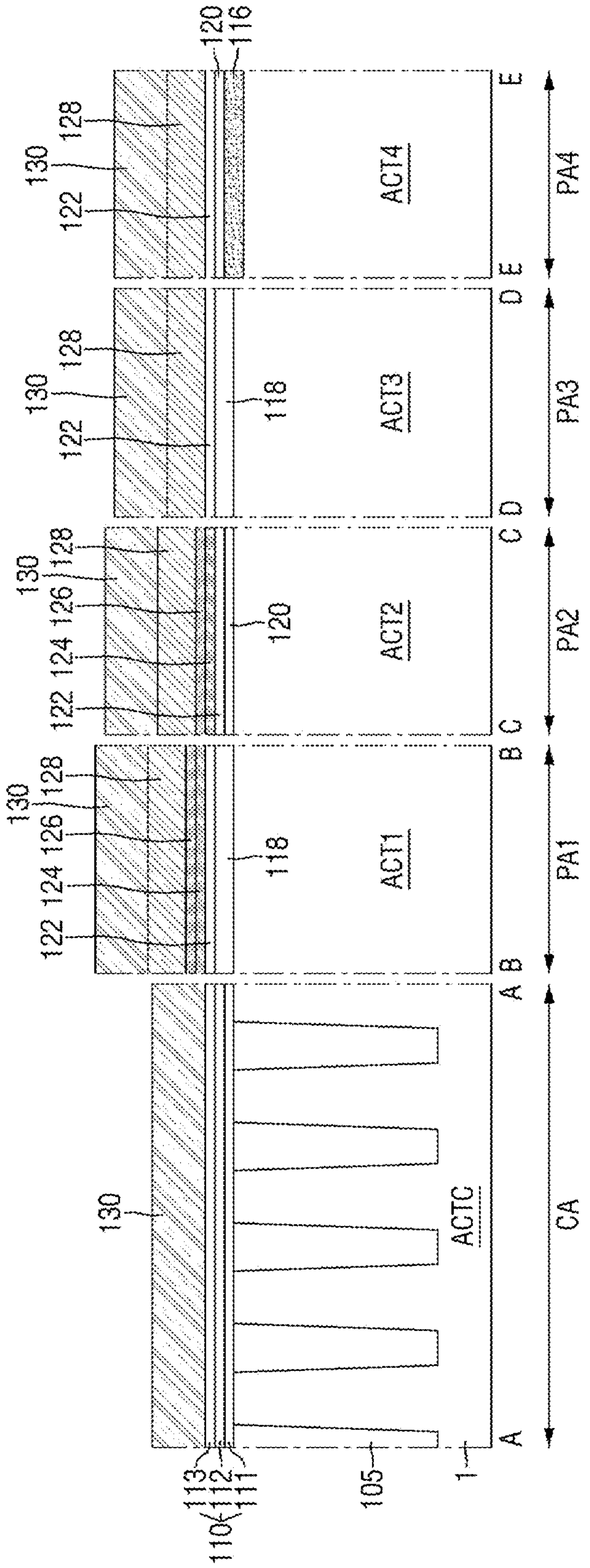

Referring to FIG. 27, the sixth mask layer MASK6 may be removed to expose the cell array region CA and the first to fourth peripheral regions PA1, PA2, PA3, and PA4.

The buffer layer 110 of the cell array region CA and the conductive layer 128 of the first to fourth peripheral regions PA1, PA2, PA3, and PA4 may be exposed. Subsequently, a lower electrode layer 130 may be formed on the front surface of the substrate 1. The lower electrode layer 130 may be formed of a polysilicon layer doped with impurities. For example, the polysilicon layer may be entirely deposited, and the ion implantation process may be performed a plurality of times. In the ion implantation process, an N-type impurity may be doped into the polysilicon layer of the cell array region CA and the first and second peripheral regions PA1 and PA2, and a P-type impurity may be doped into the polysilicon layer of the third and fourth peripheral regions PA3 and PA4.

Figure 28:
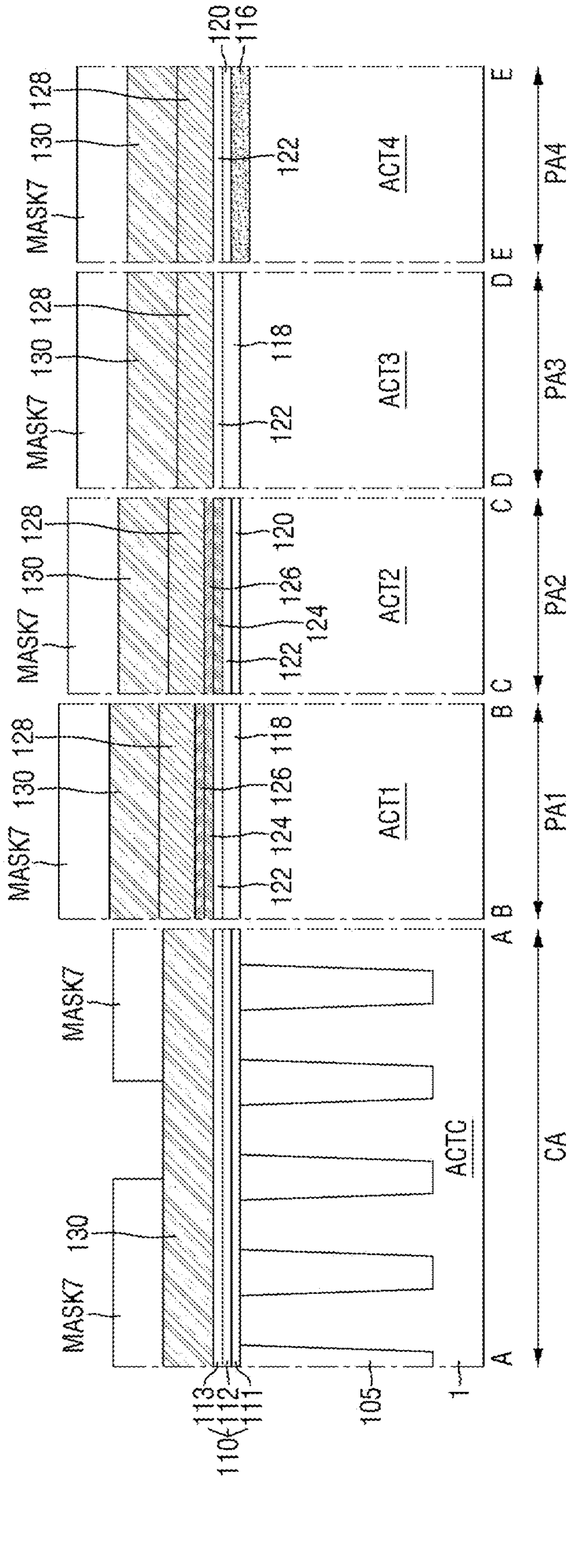
Figure 29:
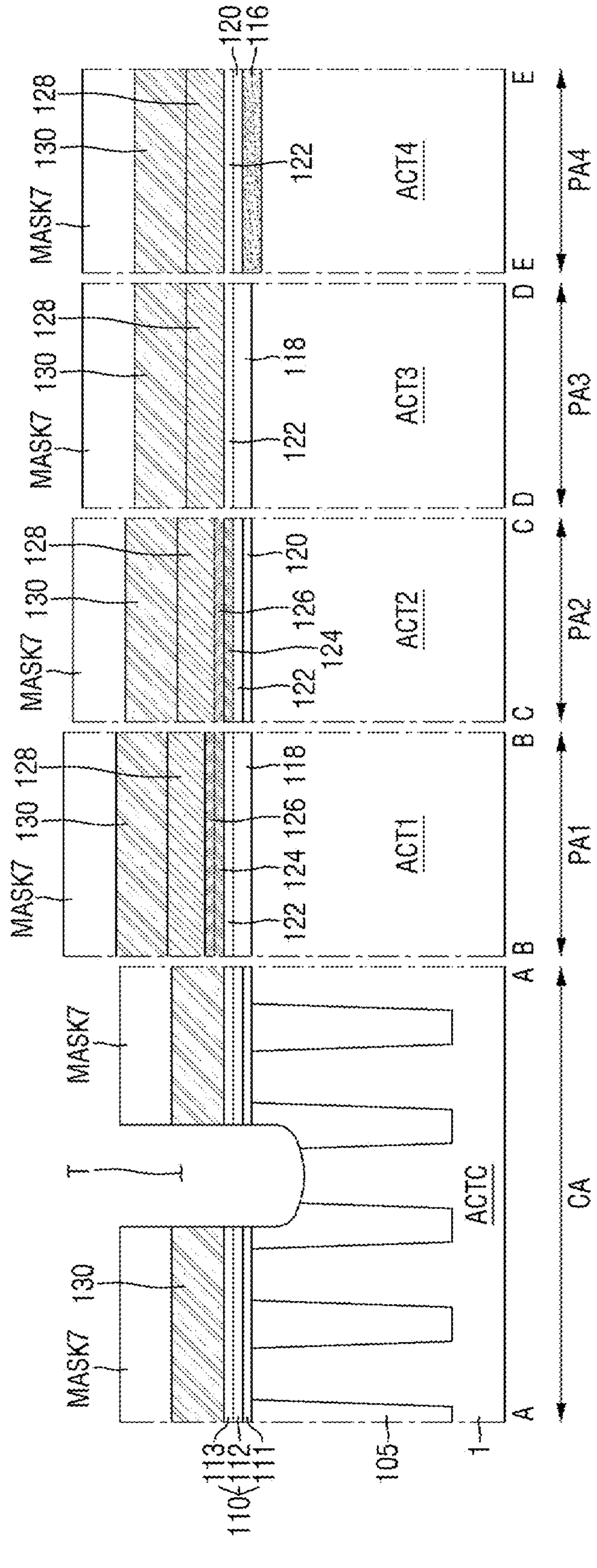

Referring to FIGS. 28 and 29, a seventh mask layer MASK7 may be formed on the lower electrode layer 130.

The seventh mask layer MASK7 may have an opening that approximately defines the position of the direct contact DC. The seventh mask layer MASK7 may be, for example, at least one of a photoresist layer, ACL, SOH, and SOC. A trench T may be formed by etching a part of the lower electrode layer 130, the buffer layer 110, and the substrate 1 of the cell array region CA by using the seventh mask layer MASK7 as an etching mask. In this case, the upper portion of the cell element isolation layer 105 may also be partially removed.

Figure 30:
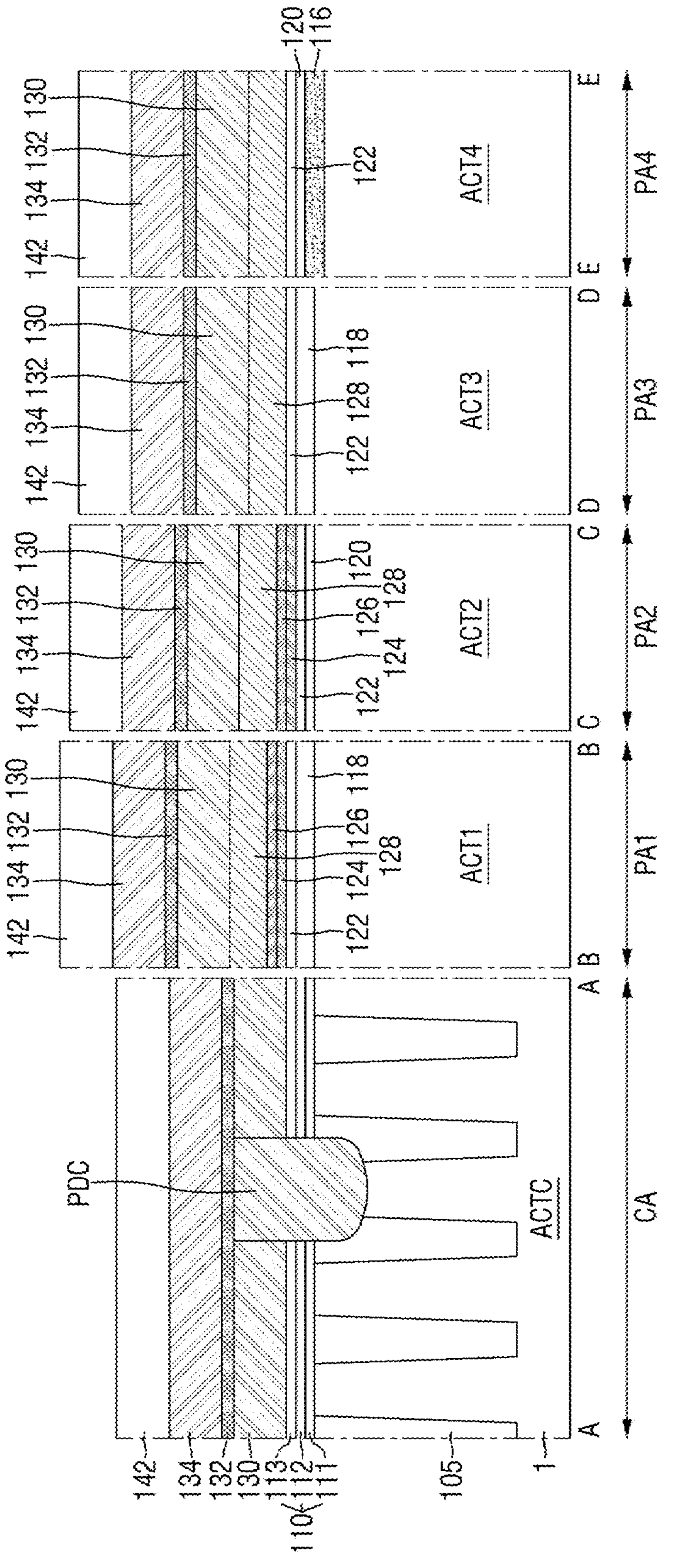

Referring to FIG. 30, the seventh mask layer MASK7 may be removed to expose the upper portion of the lower electrode layer 130.

Subsequently, a polysilicon layer doped with impurities may be deposited on the front surface of the substrate 1 to fill the trench T. Subsequently, a pre direct contact PDC may be formed by removing the polysilicon layer on the lower electrode layer 130 by performing a CMP process.

Subsequently, a middle electrode layer 132, an upper electrode layer 134, and a first capping layer 142 may be sequentially stacked on the lower electrode layer 130 and the pre direct contact PDC. The middle electrode layer 132 may be, for example, TiSiN. The upper electrode layer 134 may be, for example, tungsten. The first capping layer 142 may be, for example, silicon nitride.

Figure 31:
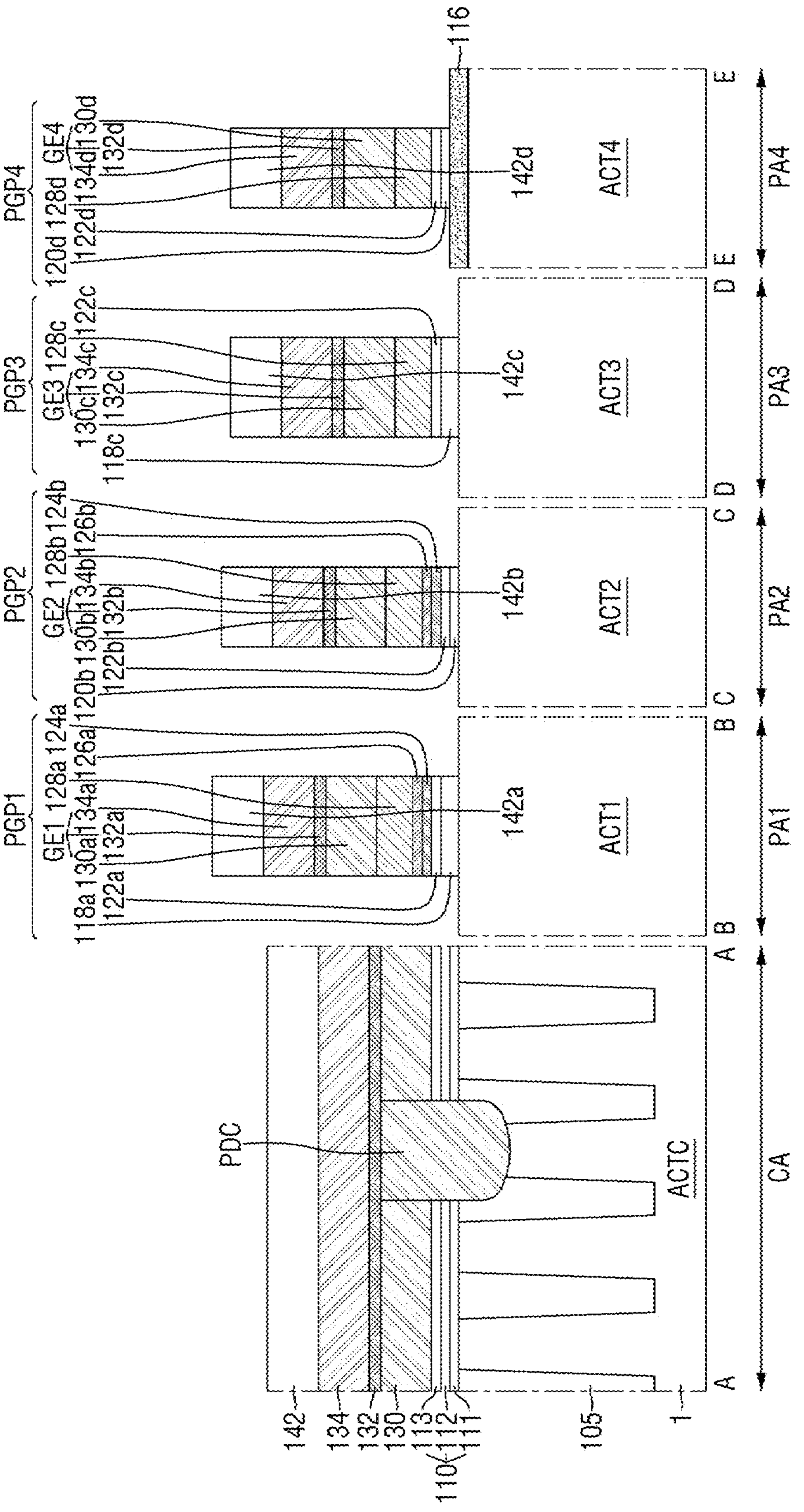

Referring to FIG. 31, the first to fourth peripheral gate capping patterns 142*a*, 142*b*, 142*c*, and 142*d* may be formed by patterning the first capping layer 142 of the first to fourth peripheral regions PA1, PA2, PA3, and PA4 by using the mask. The upper electrode layer 134, the middle electrode layer 132, and the lower electrode layer 130 may be patterned to form the first to fourth peripheral gate electrodes GE1, GE2, GE3, and GE4.

The first peripheral gate pattern PGP1 may be formed by patterning the upper electrode layer 134, the middle electrode layer 132, the lower electrode layer 130, the conductive layer 128, the N-type work function layer 126, the diffusion prevention layer 124, the pre high-k layer 122, and the high voltage gate insulating layer 118.

The second peripheral gate pattern PGP2 may be formed by patterning the upper electrode layer 134, the middle electrode layer 132, the lower electrode layer 130, the conductive layer 128, the N-type work function layer 126, the diffusion prevention layer 124, the pre high-k layer 122, and the low voltage gate insulating layer 120.

The third peripheral gate pattern PGP3 may be formed by patterning the upper electrode layer 134, the middle electrode layer 132, the lower electrode layer 130, the conductive layer 128, the pre high-k layer 122, and the high voltage gate insulating layer 118.

The fourth peripheral gate pattern PGP4 may be formed by patterning the upper electrode layer 134, the middle electrode layer 132, the lower electrode layer 130, the conductive layer 128, the pre high-k layer 122, and the low voltage gate insulating layer 120.

Subsequently, although not illustrated, an N-type impurity may be doped into the substrate 1 adjacent to the first peripheral gate pattern PGP1 and the second peripheral gate pattern PGP2. Source/drain regions may be formed around the first peripheral gate pattern PGP1 and the second peripheral gate pattern PGP2. A P-type impurity may be doped into the substrate 1 adjacent to the third peripheral gate pattern PGP3 and the fourth peripheral gate pattern PGP4. Source/drain regions may be formed around the third peripheral gate pattern PGP3 and the fourth peripheral gate pattern PGP4.

Figure 32:
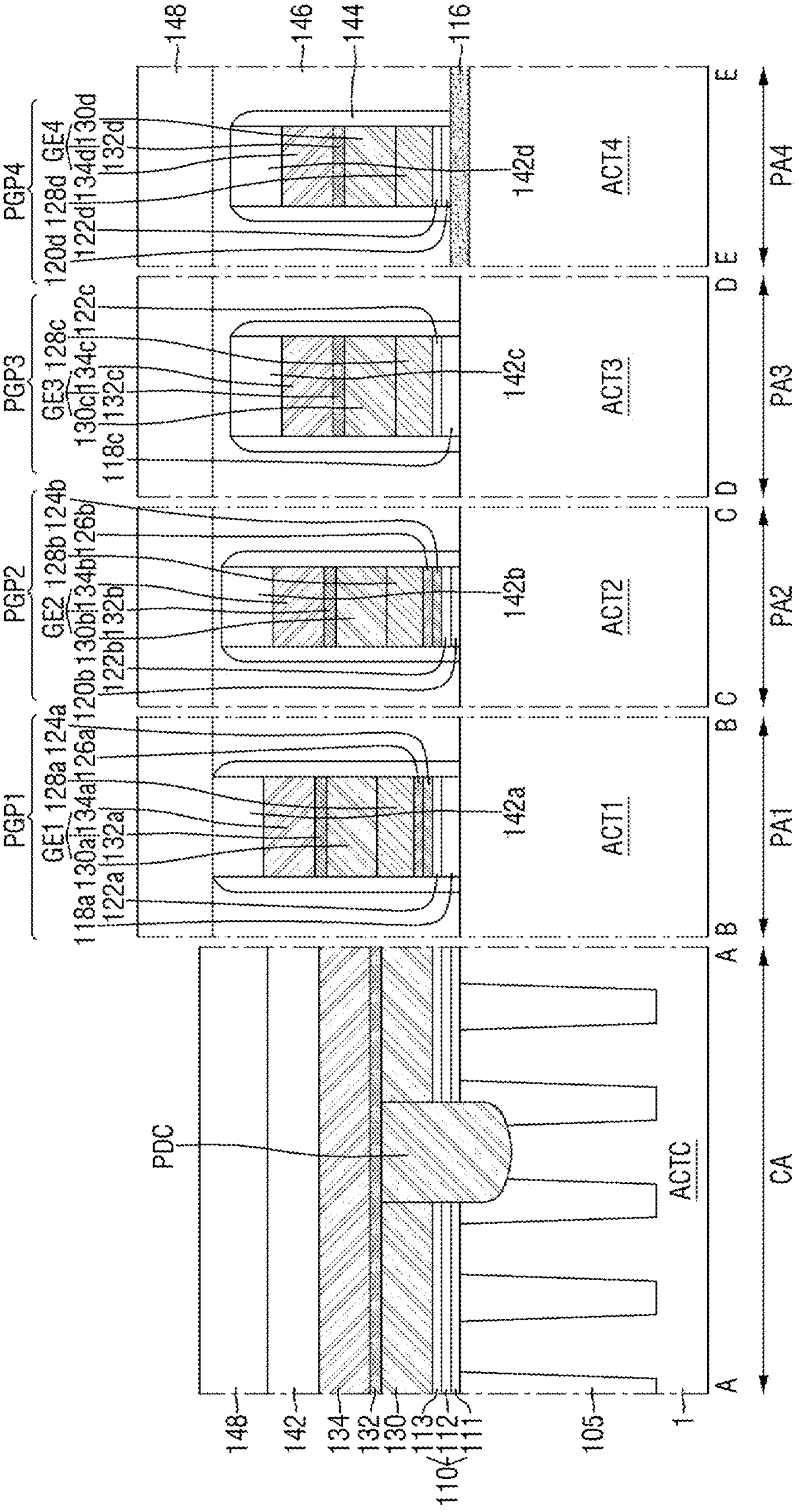

Referring to FIG. 32, the peripheral spacer 144 may be formed along sidewalls of the first to fourth peripheral gate patterns PGP1, PGP2, PGP3, and PGP4.

First, a spacer layer may be conformally formed in the first to fourth peripheral regions PA1, PA2, PA3, and PA4. The peripheral spacers 144 may be formed by etching the spacer layer.

The peripheral interlayer insulating layer 146 may be formed on the peripheral spacer 144 and the first to fourth peripheral gate capping patterns 142*a*, 142*b*, 142*c*, and 142*d*. A CMP process may be performed to expose the top surface of the first peripheral gate capping pattern 142*a*. Since the top surface of the first peripheral gate capping pattern 142*a* is positioned at the topmost portion, the top surface of the first peripheral gate capping pattern 142*a* may be exposed. However, this is only for simplicity of description and example embodiments are not limited thereto.

Subsequently, the second capping layer 148 may be formed on the front surface of the substrate 1.

Figure 33:
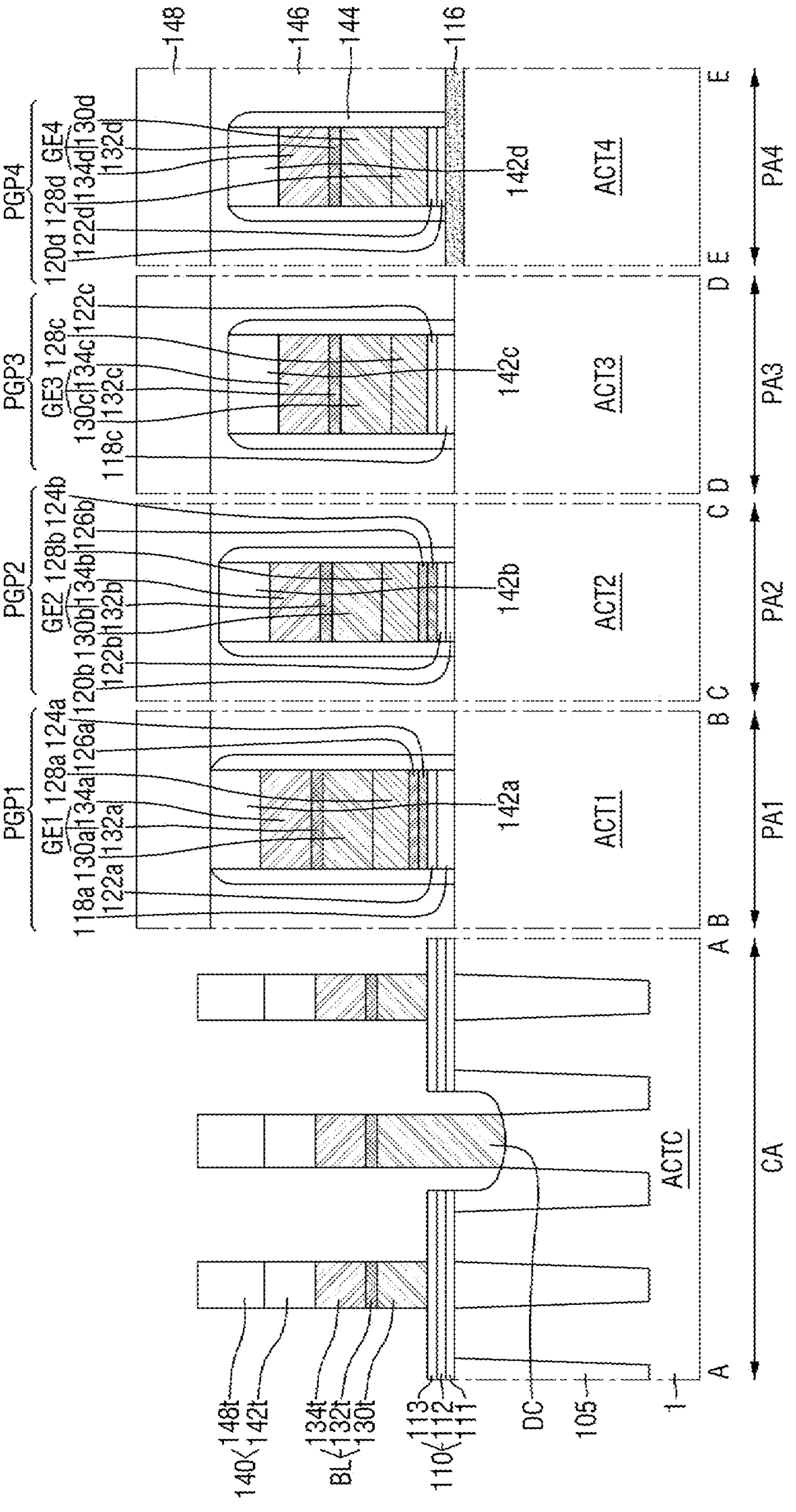

Referring to FIG. 33, the second capping layer 148, the first capping layer 142, the upper electrode layer 134, the middle electrode layer 132, and the lower electrode layer 130 of the cell array region CA may be patterned by using a mask to form the bit line capping pattern 140 and the bit line BL.

In this case, the pre direct contact DC may also be patterned to form the direct contact DC. A part of a sidewall and a bottom surface of the trench T may be exposed. Since the buffer layer 110 has a triple-layer structure including the first to third cell insulating layers 111, 112, and 113, an etching process may be easily controlled.

The bit line capping pattern 140 may include the first bit line capping pattern 142*t* and the second bit line capping pattern 148*t*. A vertical length of the bit line capping pattern 140 may be greater than a vertical length of the first to fourth peripheral gate capping patterns 142*a*, 142*b*, 142*c*, and 142*d*. Since the vertical length of the first bit line capping pattern 142*t* is the same as the vertical length of the first to fourth peripheral gate capping patterns 142*a*, 142*b*, 142*c*, and 142*d*, the vertical length of the bit line capping pattern 140 may be greater than the vertical length of the first to fourth peripheral gate capping patterns 142*a*, 142*b*, 142*c*, and 142*d*.

Figure 34:
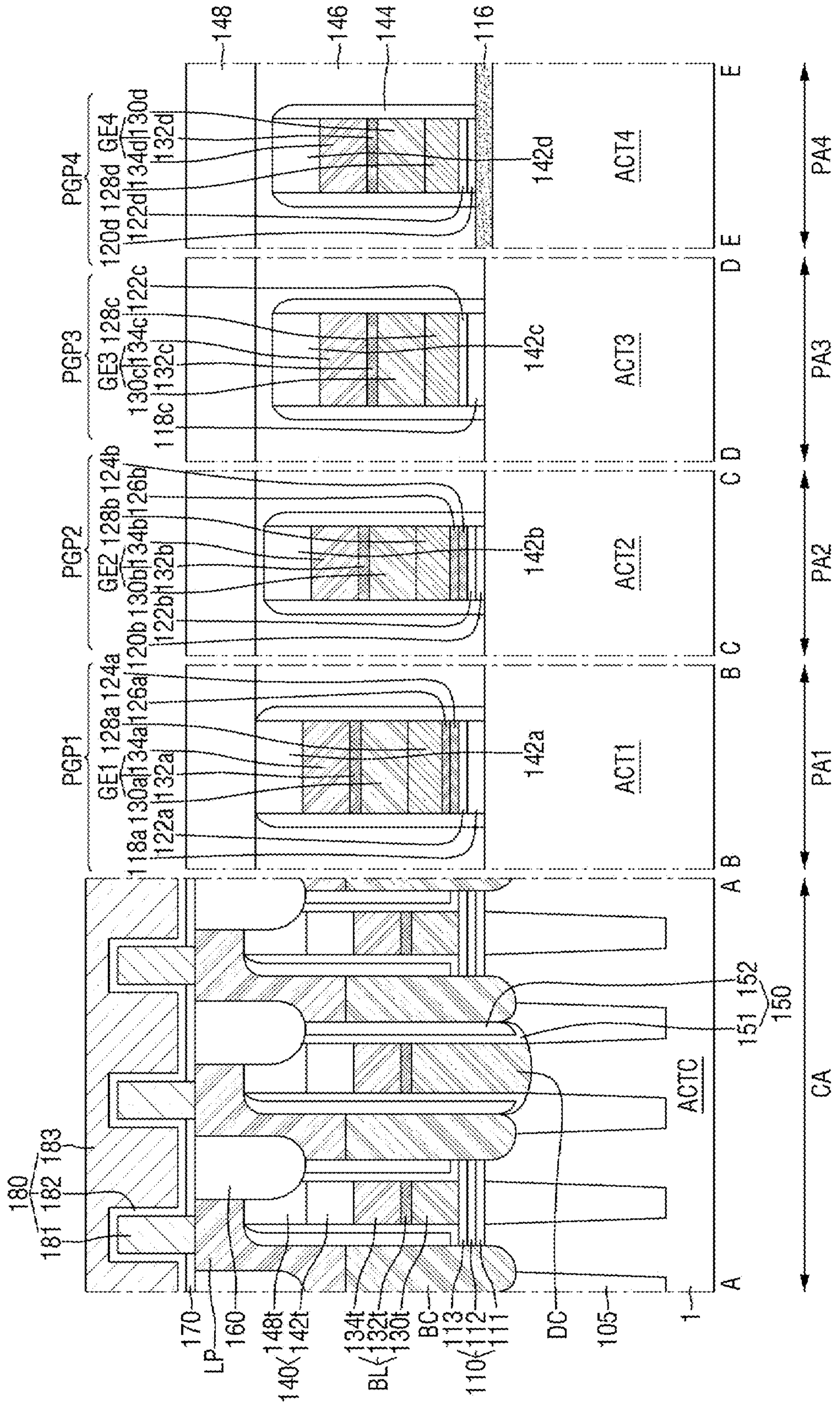

Referring to FIG. 34, the bit line spacer 150 covering the sidewall of the bit line capping pattern 140 and the bit line BL may be formed. A part of the buffer layer 110 and the substrate 1 may be removed between the bit line spacers 150 adjacent to each other by using the bit line spacer 150 and the bit line capping pattern 140 as an etching mask. Since the buffer layer 110 has a triple-layer structure including the first to third cell insulating layers 111, 112, and 113, an etching process may be easily controlled. Accordingly, a semiconductor memory device having improved reliability may be realized.

Subsequently, the buried contact BC in contact with the substrate 1 may be formed between the bit line spacers 150. The landing pad LP and the pad separation insulating layer 160 may be formed on the buried contact BC. The capacitor 180 may be formed on the landing pad LP.

In concluding the detailed description, those of ordinary skill in the art will appreciate that many variations and modifications may be made to various example embodiments without substantially departing from the principles of inventive concepts. Furthermore example embodiments are not necessarily mutually exclusive. For example, some example embodiments may include one or more features described with reference to one or more drawings, and may also include one or more other features described with reference to one or more other drawings. Therefore, the disclosed preferred embodiments of the disclosure are used in a generic and descriptive sense only and not for purposes of limitation.

What is claimed is:

1. A semiconductor memory device comprising:
- a substrate comprising an NMOS region and a PMOS region;
- a first gate pattern on the NMOS region of the substrate; and
- a second gate pattern on the PMOS region of the substrate,
- wherein the first gate pattern comprises a first high-k layer, a diffusion mitigation pattern, an N-type work function pattern, and a first gate electrode, which are sequentially stacked on the substrate,
- the second gate pattern comprises a second high-k layer and a second gate electrode which are sequentially stacked on the substrate,
- the diffusion mitigation pattern is in contact with the first high-k layer and comprises titanium nitride,
- a stacked structure of the first gate electrode, the stacked structure comprising at least two stacked films, wherein the stacked structure above a conductive pattern is same in composition and in film thickness as that of the second gate electrode, and
- the second gate pattern does not comprise the N-type work function pattern,
- the first gate pattern comprises a boundary pattern at a boundary between the N-type work function pattern and the diffusion mitigation pattern, and
- the boundary pattern comprises at least one of lanthanum titanium nitride or lanthanum titanium oxynitride.

2. The semiconductor memory device of claim 1, wherein
- the first gate pattern comprises a first conductive pattern between the N-type work function pattern and the first gate electrode, and
- the second gate pattern comprises a second conductive pattern between the second high-k layer and the second gate electrode.

3. The semiconductor memory device of claim 2, wherein a vertical length of the first conductive pattern and a vertical length of the second conductive pattern are equal to each other.

4. The semiconductor memory device of claim 2, wherein a vertical length of the first conductive pattern is less than a vertical length of the second conductive pattern.

5. The semiconductor memory device of claim 2, wherein
- the second conductive pattern is a single layer, and
- the second conductive pattern is shared with at least a part of the first conductive pattern.

6. The semiconductor memory device of claim 1, wherein the second gate pattern comprises a P-type work function pattern between the second high-k layer and the second gate electrode.

7. The semiconductor memory device of claim 6, wherein the first gate pattern comprises the P-type work function pattern.

8. The semiconductor memory device of claim 1, wherein the diffusion mitigation pattern is in contact with the N-type work function pattern, and is a single layer.

9. The semiconductor memory device of claim 1, wherein the N-type work function pattern comprises at least one of lanthanum (La), lanthanum oxide (LaO), magnesium (Mg), magnesium oxide (MgO), tantalum (Ta), tantalum nitride (TaN), or niobium (Nb).

10. The semiconductor memory device of claim 1, further comprising:
- a first gate capping pattern on the first gate pattern; and
- a second gate capping pattern on the second gate pattern,
- wherein a top surface of the first gate capping pattern is on a same plane as a top surface of the second gate capping pattern.

11. The semiconductor memory device of claim 1, further comprising, in the PMOS region, a channel layer between the substrate and the second high-k layer and comprising silicon germanium.

12. A semiconductor memory device comprising:
- a substrate comprising an NMOS region and a PMOS region;
- a first gate pattern on the NMOS region of the substrate;
- a second gate pattern on the PMOS region of the substrate, and
- a dummy gate pattern between the first gate pattern and the second gate pattern,
- wherein the first gate pattern comprises a first high-k layer, a diffusion mitigation pattern, an N-type work function pattern, and a first gate electrode, which are sequentially stacked on the substrate,
- the second gate pattern comprises a second high-k layer and a second gate electrode which are sequentially stacked on the substrate,
- the diffusion mitigation pattern is in contact with the first high-k layer,
- a stacked structure of the first gate electrode is same as that of the second gate electrode,
- the second gate pattern does not comprise the N-type work function pattern, and
- the dummy gate pattern including the diffusion mitigation pattern on one side thereof and not including the diffusion mitigation pattern on another side thereof.

13. The semiconductor memory device of claim 12, wherein
- the first gate pattern comprises a first conductive pattern between the N-type work function pattern and the first gate electrode, and
- the second gate pattern comprises a second conductive pattern between the second high-k layer and the second gate electrode.

14. The semiconductor memory device of claim 13, wherein a vertical length of the first conductive pattern is less than a vertical length of the second conductive pattern.

15. The semiconductor memory device of claim 13, wherein
- the second conductive pattern is a single layer, and
- the second conductive pattern is shared with at least a part of the first conductive pattern.

16. The semiconductor memory device of claim 12, wherein the second gate pattern comprises a P-type work function pattern between the second high-k layer and the second gate electrode.

17. The semiconductor memory device of claim 12, wherein the first gate pattern comprises a boundary pattern at a boundary between the N-type work function pattern and the diffusion mitigation pattern.

18. The semiconductor memory device of claim 17, wherein the boundary pattern comprises at least one of lanthanum titanium nitride or lanthanum titanium oxynitride.

* * * * *